US008809906B2

(12) United States Patent
Zhu et al.

(10) Patent No.: US 8,809,906 B2
(45) Date of Patent: Aug. 19, 2014

(54) SEMICONDUCTOR OPTICAL DEVICE

(75) Inventors: Lei Zhu, Atsugi (JP); Shigeaki Sekiguchi, Zama (JP); Shinsuke Tanaka, Hiratsuka (JP); Kenichi Kawaguchi, Ebina (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/613,177

(22) Filed: Sep. 13, 2012

(65) Prior Publication Data

US 2013/0126941 A1 May 23, 2013

(30) Foreign Application Priority Data

Nov. 21, 2011 (JP) ................................. 2011-254445

(51) Int. Cl.
*H01L 31/102* (2006.01)

(52) U.S. Cl.
USPC ........... 257/184; 257/616; 257/458; 438/479; 438/98; 385/129; 385/42; 385/132

(58) Field of Classification Search
USPC ................... 438/479, 98; 257/616, 458, 184; 385/129, 42, 132; 117/84; 359/279
See application file for complete search history.

(56) References Cited

U.S. PATENT DOCUMENTS

| 5,107,538 | A |   | 4/1992 | Benton |     |
|---|---|---|---|---|---|
| 5,559,912 | A | * | 9/1996 | Agahi et al. | 385/42 |
| 7,289,712 | B2 | * | 10/2007 | Kim et al. | 385/132 |
| 7,397,101 | B1 | * | 7/2008 | Masini et al. | 257/458 |
| 8,290,325 | B2 | * | 10/2012 | Reshotko et al. | 385/129 |
| 2002/0174827 | A1 | * | 11/2002 | Samoilov et al. | 117/84 |
| 2005/0221591 | A1 | * | 10/2005 | Bedell et al. | 438/479 |
| 2006/0039666 | A1 | * | 2/2006 | Knights et al. | 385/129 |
| 2008/0054269 | A1 | * | 3/2008 | Yamazaki et al. | 257/72 |

(Continued)

FOREIGN PATENT DOCUMENTS

| JP | H5-175592 | 7/1993 |
|---|---|---|
| JP | 2004-325914 A1 | 11/2004 |
| JP | 2005-250267 | 9/2005 |

OTHER PUBLICATIONS

L. Naval, et al.; "Optimization of Si1-xGex/Si Waveguide Photodetectors Operating at lamda = 1.3 um;" Journal of Lightwave Technology; vol. 14; No. 5; May 1996; pp. 787-797 (11 Sheets)/p. 1 of specification.

(Continued)

*Primary Examiner* — Bac Au
*Assistant Examiner* — Sophia Nguyen
(74) *Attorney, Agent, or Firm* — Kratz, Quintos & Hanson, LLP

(57) ABSTRACT

A semiconductor optical device includes a first clad layer, a second clad layer and an optical waveguide layer sandwiched between the first clad layer and the second clad layer, wherein the optical waveguide layer includes a first semiconductor layer, a second semiconductor layer disposed on the first semiconductor layer and extending in one direction, and a third semiconductor layer covering a top surface of the second semiconductor layer, and wherein the first semiconductor layer includes an n-type region disposed on one side of the second semiconductor layer, a p-type region disposed on the other side of the second semiconductor layer, and an i-type region disposed between the n-type region and the p-type region, and wherein the second semiconductor layer has a band gap narrower than band gaps of the first semiconductor layer and the third semiconductor layer.

10 Claims, 30 Drawing Sheets

(56) References Cited

U.S. PATENT DOCUMENTS

| | | | |
|---|---|---|---|
| 2008/0304786 A1* | 12/2008 | Ishibashi et al. | 385/3 |
| 2009/0081850 A1* | 3/2009 | Ohnuma et al. | 438/458 |
| 2009/0269878 A1* | 10/2009 | Leon et al. | 438/98 |
| 2009/0302426 A1* | 12/2009 | McLaughlin et al. | 257/616 |
| 2011/0109955 A1* | 5/2011 | Park et al. | 359/279 |
| 2013/0001643 A1* | 1/2013 | Yagi | 257/184 |

OTHER PUBLICATIONS

C. Van De Walle, et al.; "Theoretical Calculations of heterojunction discontinuities in the Si/Ge system;" Physical Review B; vol. 34; No. 8; Oct. 15, 1986; pp. 5621-5634 (14 Sheets)/p. 1 of specification.

* cited by examiner

SEMICONDUCTOR OPTICAL DEVICE

CROSS-REFERENCE TO RELATED APPLICATION

This application is based upon and claims the benefit of priority of the prior Japanese Patent Application No. 2011-254445, filed on Nov. 21, 2011, the entire contents of which are incorporated herein by reference.

FIELD

The embodiments discussed herein are related to a semiconductor optical device.

BACKGROUND

In recent years, attention is paid on a semiconductor optical device formed on an SOI (Silicon on Insulator) substrate. The semiconductor optical device includes a first clad, a second clad and an optical waveguide layer sandwiched between the first clad and the second clad. The optical waveguide layer includes an i-type core, an n-type slab portion which is thinner than the core and disposed on one side thereof, and a p-type slab portion thinner than the core and disposed on the opposite side of the core from the n-type slab layer.

As such, the semiconductor optical device formed on the SOI substrate is an optical waveguide device including a p-i-n homojunction (hereafter referred to as homojunction optical waveguide device). (For example, refer to Japanese Laid-open Patent publication No. 2004-325914; L. Naval, R. Jalali, L. Gomelsky, and J. M. Liu, "Optimization of $Si_{1-x}Ge_x$/Si Waveguide Photodetectors Operating at 1.3 um", Journal of Lightwave Technology, Vol. 14, pp. 787-797, 1996; and Chris G. Van de Walle and Richard M. Martin, "Theoretical calculations of heterojunction discontinuities in the Si/Ge system", Vol. 34, pp. 5621-5633, 1986.)

Carriers are injected into the i-type core when a voltage is applied between the p-type slab portion and the n-type slab portion of the homojunction optical waveguide device. This produces a variation in the refractive index and the loss coefficient of the core. Accordingly, by varying a voltage applied between the p-type slab portion and the n-type slab portion, it is possible to vary the phase and the intensity of light which propagates through the core (hereafter referred to as propagating light).

However, since there is no barrier in the p-i-n homojunction to retain the injected carriers within the junction portion, it is difficult to obtain a high carrier density in the junction portion. To cope therewith, in the homojunction optical waveguide device, the phase or the intensity of the propagating light is varied to a desired value by injecting a large amount of currents into the p-i-n homojunction. Alternatively, the phase or the intensity of the propagating light is varied to a desired value by elongating the device length. As a result, there is a problem in the homojunction optical waveguide device that power consumption becomes large or the device length becomes long.

SUMMARY

According to an aspect of the embodiments, a semiconductor optical device includes a first clad layer, a second clad layer and an optical waveguide layer sandwiched between the first clad layer and the second clad layer, wherein the optical waveguide layer includes a first semiconductor layer, a second semiconductor layer disposed on the first semiconductor layer and extending in one direction, and a third semiconductor layer covering a top surface of the second semiconductor layer, and wherein the first semiconductor layer includes an n-type region disposed on one side of the second semiconductor layer, a p-type region disposed on the other side of the second semiconductor layer, and an i-type region disposed between the n-type region and the p-type region, and wherein and the second semiconductor layer has a band gap narrower than band gaps of the first semiconductor layer and the third semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

According to the semiconductor optical device of the present embodiments, it is possible to reduce the power consumption thereof or shorten the device length. The embodiments will be explained with reference to accompanying drawings.

(Embodiment 1)

The semiconductor optical device according to the present embodiment is a Mach-Zehnder optical switch (hereafter referred to as MZ optical switch).

(1) Phase Shifter Portion

Figure 1:
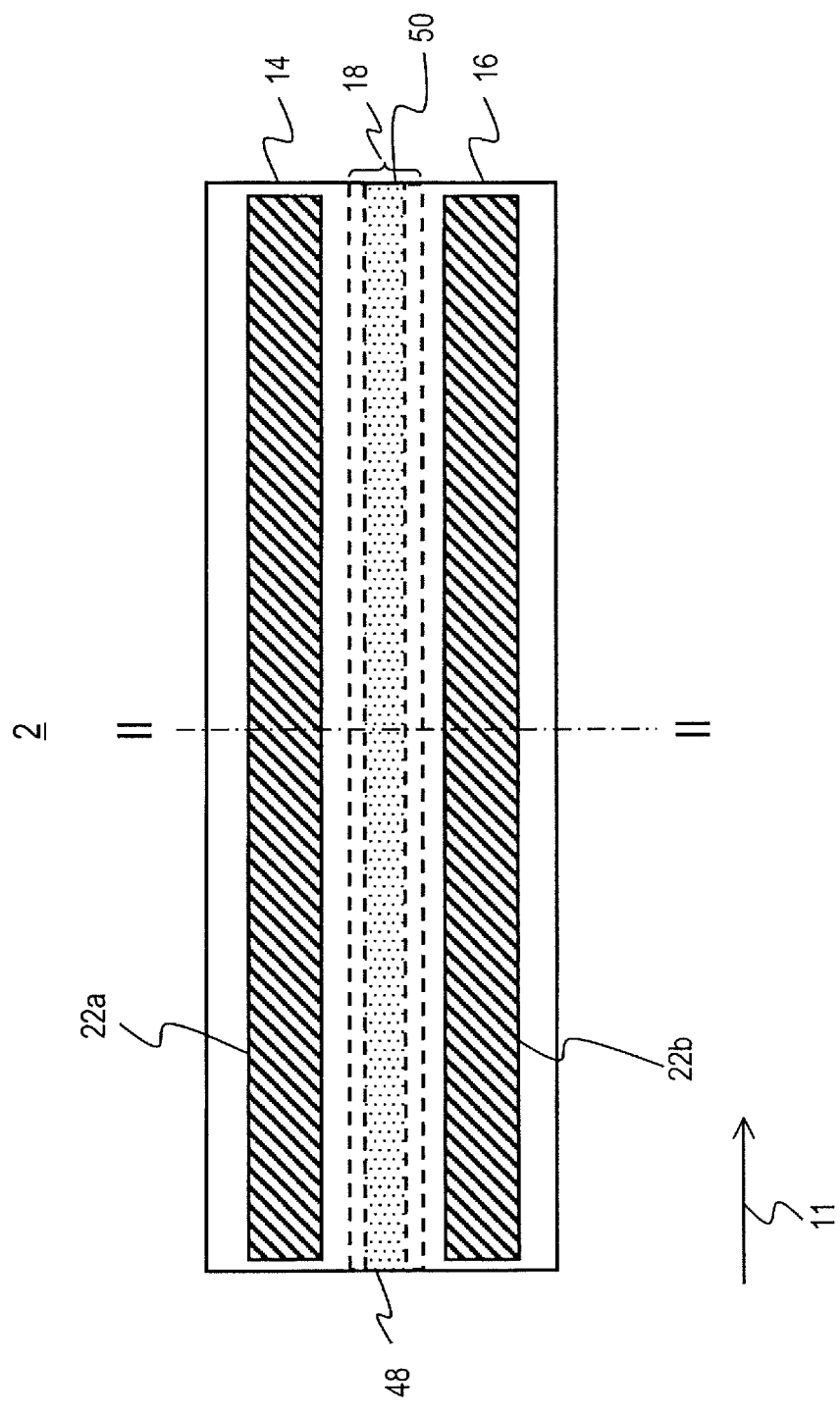
FIG. 1 is a plan view of a phase shifter portion 1.
Figure 2:
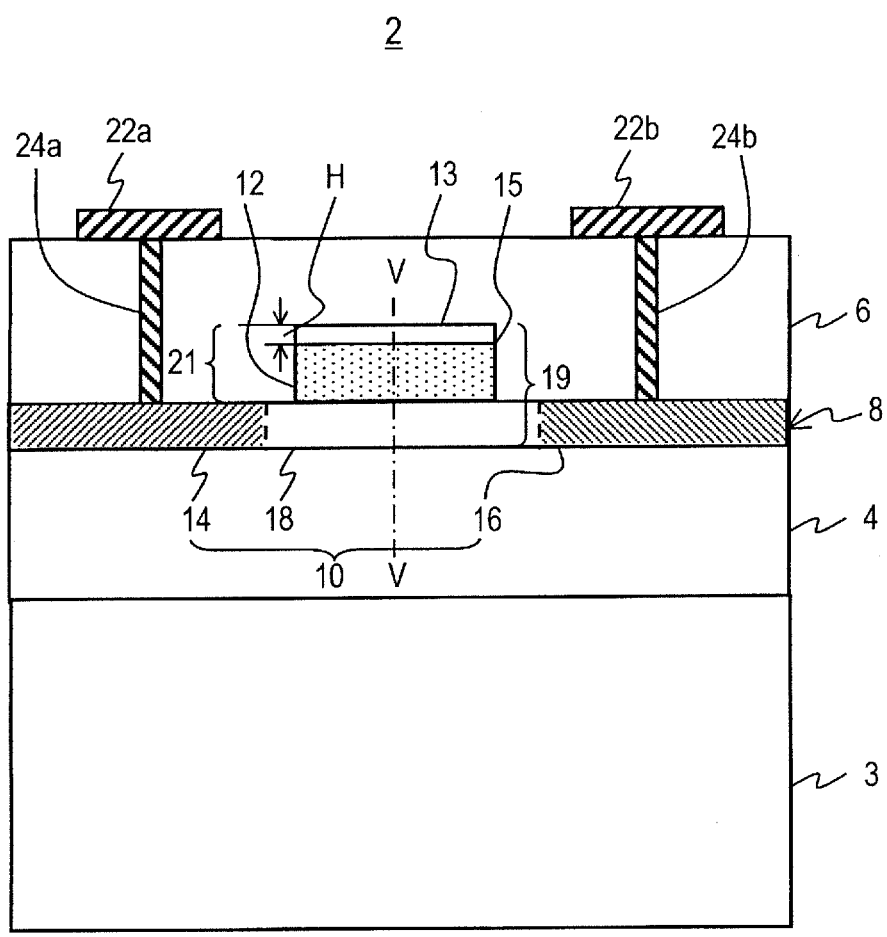
FIG. 2 is a cross-sectional view along line II-II depicted in FIG. 1.

FIG. 1 is a plan view of a phase shifter portion 2 of the MZ optical switch according to the present embodiment. FIG. 2 is a cross-sectional view along line II-II depicted in FIG. 1.

As depicted in FIG. 2, the phase shifter portion 2 includes a first clad layer (for example, $SiO_2$ layer of an SOI substrate) 4 provided on a substrate (for example, a Si substrate of the SOI substrate) 3 and a second clad layer (for example, a $SiO_2$ layer) 6. Here, the first clad layer 4 and the second clad layer 6 are insulators.

Further, the phase shifter portion 2 includes an optical waveguide layer 8 sandwiched between the first clad layer 4 and the second clad layer 6. The optical waveguide layer 8 includes a first semiconductor layer (for example, single-crystal silicon layer of the SOI substrate) 10 and an i-type second semiconductor layer (for example, single-crystal silicon-germanium layer) 12 which is provided on the first semiconductor layer 10 and extends in one direction 11. The optical waveguide layer 8 further includes a third semiconductor layer (for example, single-crystal silicon layer) 13 which covers a top surface (a surface opposite to a surface on the side of the first semiconductor layer 10) 15 of the second semiconductor layer 12.

The first semiconductor layer 10 includes an n-type region 14 provided on one side of the second semiconductor layer 12 and a p-type region 16 provided on the other side of the second semiconductor layer 12 (so as to face the n-type region 14 across the second semiconductor layer 12 in a planar view). The first semiconductor layer 10 further includes an i-type region 18 provided between the n-type region 14 and the p-type region 16.

The i-type region 18 is a region having carrier concentration (impurity concentration) smaller than the n-type region 14 and the p-type region 16. The n-type region 14, the p-type region 16 and the i-type region 18 form a p-i-n homojunction.

Further, the second semiconductor layer (for example, SiGe layer) 12 is a semiconductor layer having a band gap narrower than those of the first semiconductor layer (for example, Si layer) 10 and the third semiconductor layer (for example, Si layer) 13.

The first clad layer 4, the second clad layer 6 and the optical waveguide layer 8 are transparent at an operating wavelength (for example, 1.55 μm). The refractive index of the optical waveguide layer 8 is larger than each refractive index of the first clad layer 4 and the second clad layer 6. Therefore, light entering the phase shifter portion 2 propagates through the optical waveguide layer 8.

As depicted in FIG. 2, the optical waveguide layer 8 is provided with a core 19 which includes the third semiconductor layer 13, the second semiconductor layer 12 and the first semiconductor layer 10 underneath the second semiconductor layer 12. The light which propagates through the optical waveguide layer 8 (propagating light) propagates through the core 19.

Now, the refractive index of a semiconductor has a tendency to be higher as the band gap becomes narrower. For example, the band gaps of Si, $Si_{0.9}Ge_{0.1}$ and $Si_{0.7}Ge_{0.3}$ are 1.12 eV, 1.02 eV and 0.888 eV, respectively. Concerning the above band gaps, the refractive indexes of Si, $Si_{0.9}Ge_{0.1}$ and $Si_{0.7}Ge_{0.3}$ are 3.36, 3.42 and 3.55, respectively. Therefore, the propagating light mainly propagates through the second semiconductor layer 12 having the narrowest band gap in the core 19.

Further, as depicted in FIG. 2, the phase shifter portion 2 includes a first external electrode 22a, provided on the second clad layer 6, and a first connection conductor 24a for connecting the first external electrode 22a to the n-type region 14.

Similarly, the phase shifter portion 2 includes a second external electrode 22b, provided on the second clad layer 6, and a second connection conductor 24b for connecting the second external electrode 22b to the p-type region 16.

Now, as depicted in FIG. 2, a space is provided between the second semiconductor 12 and the n-type region 14. Similarly, a space is provided between the second semiconductor 12 and the p-type region 16. These spaces suppress the penetration of the propagating light into the n-type region 14 and the p-type region 16, so as to reduce the loss of the propagating light.

—Band Structure—

Figure 3:
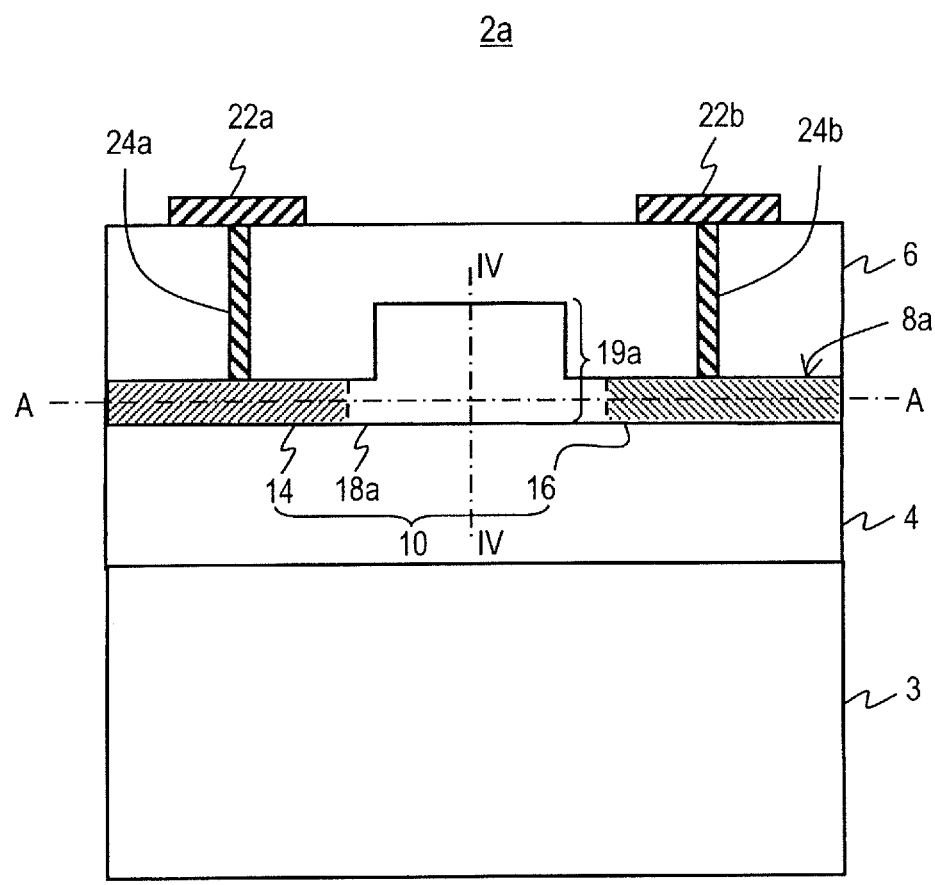
FIG. 3 is a cross-sectional view of a phase shifter portion using a silicon core.

FIG. 3 is a cross-sectional view of a phase shifter portion (hereafter referred to as homojunction phase shifter portion) 2a using a silicon core. As depicted in FIG. 3, an optical waveguide layer 8a of the homojunction phase shifter portion 2a is formed of a single-layered semiconductor (for example, Si layer). At the center portion of the optical waveguide layer 8a, there is provided an i-type region 18a sandwiched between the n-type region 14 and the p-type region 16. The center of the i-type region 18a forms a core 19a having a thickness larger than a peripheral region (slab portion).

Figure 4:
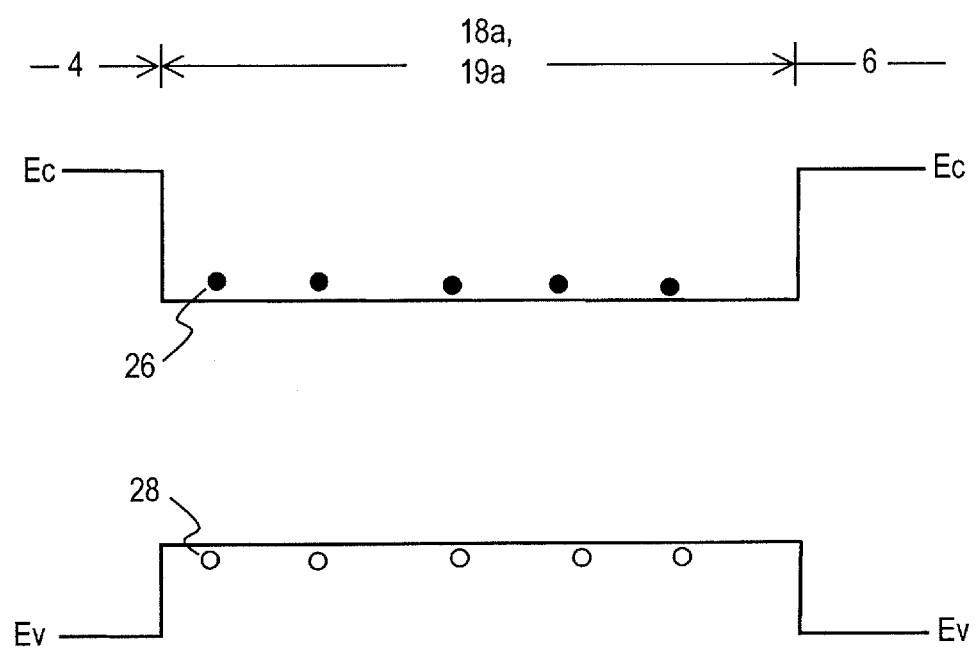
FIG. 4 is an energy band diagram along line IV-IV depicted in FIG. 3.
Figure 5:
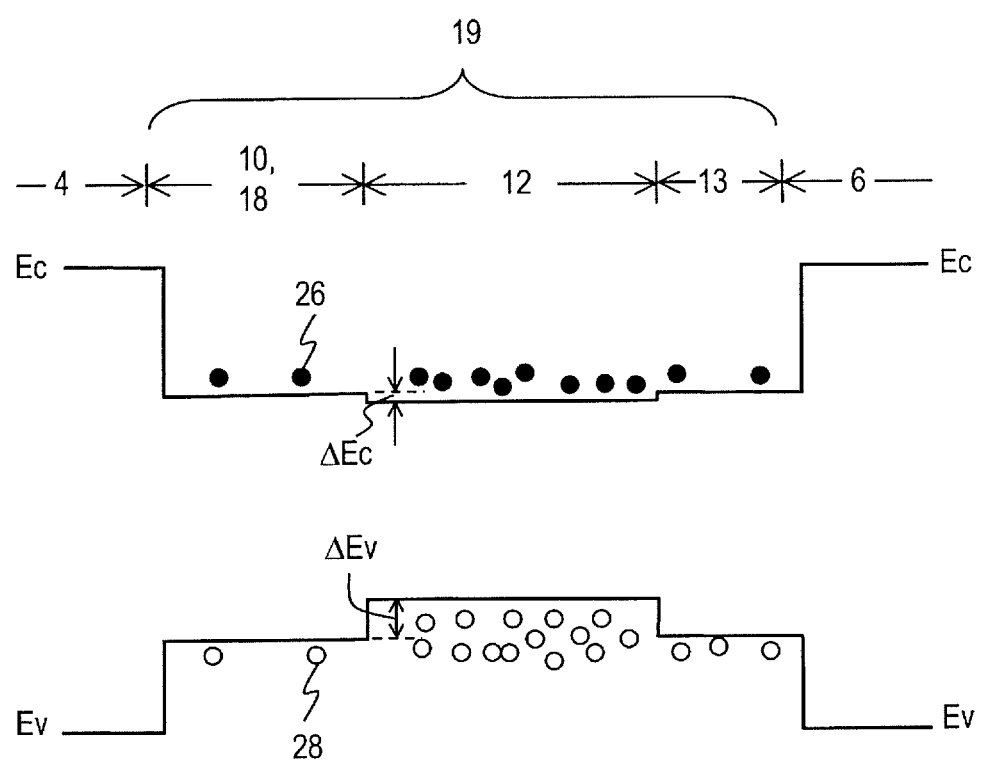
FIG. 5 is an energy band diagram along line V-V depicted in FIG. 2.

FIG. 4 is an energy band diagram along line IV-IV depicted in FIG. 3. FIG. 5 is an energy band diagram along line V-V depicted in FIG. 2. Each $E_C$ depicted in FIGS. 4 and 5 represents energy of the conduction band edge. $E_V$ represents energy of the valence band edge. Further, symbols depicted in the upper parts of FIGS. 4 and 5 represent the symbols of the semiconductor layers corresponding to the respective regions.

The homojunction phase shifter portion 2a includes a p-i-n homojunction along line A-A depicted in FIG. 3. When a forward voltage is applied to the p-i-n homojunction, carriers (electrons 26 and holes 28) are supplied to the i-type core 19a, as depicted in FIG. 4. The refractive index of the core 19a is varied by the carriers, so that the phase of the propagating light is varied. The variation of the refractive index of the core 19a is produced by a plasma effect of the carriers.

In the homojunction phase shifter portion 2a, the band structure of the core 19a is flat, as depicted in FIG. 4. Therefore, no barrier exists in the core of the homojunction phase shifter portion 2a to retain the supplied carriers.

Accordingly, to obtain a desired phase variation in the homojunction phase shifter portion 2a, a large amount of carriers are injected into the p-i-n junction. Alternatively, the desired phase variation is obtained by elongating the phase shift portion. As a result, in the MZ optical switch including the homojunction phase shifter portion 2a (hereafter referred to as homojunction MZ optical switch), there is the problem that power consumption becomes large or a device length becomes long.

In the phase shifter portion 2 according to the present embodiment, the band gap of the second semiconductor layer 12 is narrower than the band gap of the first semiconductor layer 10, as depicted in FIG. 5. As a result, in the phase shifter portion 2, the conduction band edge $E_C$ of the second semiconductor layer 12 is lower than the conduction band edge $E_C$ of the first semiconductor layer 10. Similarly, the valence band edge $E_V$ of the second semiconductor layer 12 is higher than the valence band edge $E_V$ of the first semiconductor layer 10. As a result, in the phase shifter portion 2, an energy difference $\Delta E_C$ at the conduction band edge and an energy difference $\Delta E_V$ at the valence band edge are respectively generated between the second semiconductor layer 12 and the first semiconductor layer 10.

In the phase shifter portion 2, first, electrons 26 supplied from the n-type region 14 to the core 19 are moved to the i-type region 18 of the first semiconductor layer 10. Next, the electrons are diffused from the i-type region 18 to the second semiconductor layer 12. In regard to the electrons diffused to the second semiconductor layer 12, back diffusion to the i-type region 18 is suppressed by $\Delta E_C$. As a result, the electrons are accumulated into the second semiconductor layer 12, so that an electron density in the second semiconductor layer 12 is increased. Similarly, holes 28 supplied into the core 19 are accumulated into the second semiconductor layer 12, so that a hole density in the second semiconductor layer 12 is increased.

Thus, according to the MZ optical switch of the present embodiment, power consumption (=current×voltage) to obtain a desired phase variation is reduced, as compared to the homojunction MZ optical switch. Alternatively, when the phase variation of the propagating light is adjusted by a device length, not by the power consumption, according to the MZ optical switch of the present embodiment, the device length to obtain a desired phase variation is shortened, as compared to the homojunction MZ optical switch.

Figure 6:
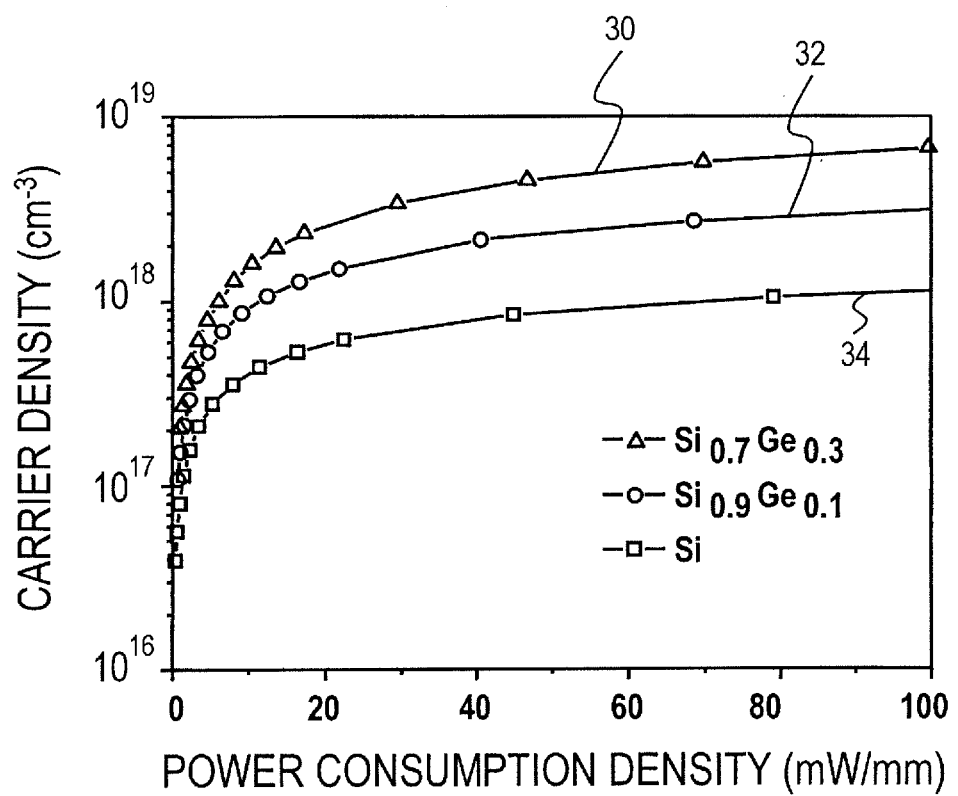
FIG. 6 is a diagram depicting relationships between a power consumption density in the phase shifter portion and a carrier density in the second semiconductor layer.

FIG. 6 is a diagram depicting relationships between a power consumption density in the phase shifter portion 2 and a carrier density in the second semiconductor layer 12. The horizontal axis denotes the power consumption density (=current×voltage/length of phase shifter portion). The vertical axis denotes the carrier density (=electron density+hole density) in the second semiconductor layer 12 which is the main portion of the core 19. The carrier density is obtained by a simulation program for analyzing carrier conduction in a semiconductor device.

The first semiconductor layer 10 in a simulation model of an analysis target is a Si (silicon) layer of 50 nm in thickness. The second semiconductor layer 12 is a SiGe (silicon-germanium) layer of 150 nm in thickness and 480 nm in width. The third semiconductor layer 13 is a Si (silicon) layer of 50 nm in thickness and 480 nm in width.

Carrier concentrations in the n-type region 14 and the p-type region 16 are $1\times10^{19}$ cm$^{-3}$, respectively. The lifetime of minority carriers is 1 ns. The plane directions of the first semiconductor layer 10, the second semiconductor layer 12 and the third semiconductor layer 13 are (100). An interval between the second semiconductor layer 12 and the n-type region 14 is 0.275 µm. Further, an interval between the second semiconductor layer 12 and the p-type region 16 is also 0.275 µm.

In FIG. 6, a first curve 30 and a second curve 32 depict relationships when the second semiconductor layer 12 is a $Si_{0.7}Ge_{0.3}$ layer and a $Si_{0.9}Ge_{0.1}$ layer, respectively. On the other hand, a curve 34 depicts the relationship between a power consumption density and a carrier density in the core concerning the homojunction phase shifter portion 2a. The parameters of the homojunction phase shifter portion 2a (such as a core size, the size of the first semiconductor layer 10 and carrier concentrations in the n-type and p-type regions) are identical to those of the phase shifter portion 2.

When the second semiconductor layer 12 is the $Si_{0.9}Ge_{0.1}$ layer, $\Delta E_C$ and $\Delta E_V$ are 0.02 eV and 0.083 eV, respectively. Also, when the second semiconductor layer 12 is the $Si_{0.7}Ge_{0.3}$ layer, $\Delta E_C$ and $\Delta E_V$ are 0.03 eV and 0.203 eV, respectively.

As depicted in FIG. 6, each carrier density 30, 32 of the second semiconductor layer 12 (the main portion of the core 19) in the phase shifter portion 2 is greatly higher than the carrier density 34 in the core 19a of the homojunction phase shifter portion 2a.

When the second semiconductor layer 12 is the $Si_{0.9}Ge_{0.1}$ layer, the carrier density therein is approximately three times higher than the carrier density in the core of the homojunction phase shifter portion 2a, in a region where the power consumption density is 50-100 mW/mm. Also, when the second semiconductor layer 12 is the $Si_{0.7}Ge_{0.3}$ layer, the carrier density in the second semiconductor layer 12 is approximately five times higher than the carrier density in the core of the homojunction phase shifter portion 2a, in the region where the power consumption density is 50-100 mW/mm.

With this, the phase variation of the propagating light at the output port 50 of the phase shifter portion 2 is greatly larger than the phase variation of the propagating light at the output port of the homojunction phase shifter portion 2a.

Now, when the height and the width of a convex portion 21 (laminate structure of the second semiconductor layer 12 and the third semiconductor layer 13) on the first semiconductor layer 10 are within a certain range, the propagating light is a single mode. Therefore, the height and the width of the convex portion on the first semiconductor layer 10 are set to be certain values within the above range. As a result, when the third semiconductor layer 13 is provided on the upper surface of the second semiconductor layer 12, the thickness of the second semiconductor layer 12 becomes thinner.

As mentioned earlier, the band gap of the second semiconductor layer 12 is narrower than the band gap of the third semiconductor layer 13. Therefore, electrons and holes supplied to the core 19 are accumulated in the second semiconductor layer which is thinner by the thickness of the third semiconductor layer 13. By this, the carrier density in the second semiconductor layer 12 becomes higher than that accumulated when the third semiconductor layer 13 is not provided. As a result, variation in the refractive index of the second semiconductor layer 12 becomes larger, and power consumption of the MZ optical switch (power to switch off output light) becomes smaller than power consumption of a phase shifter portion which does not include the third semiconductor layer 13.

(2) Overall Structure

Figure 7:
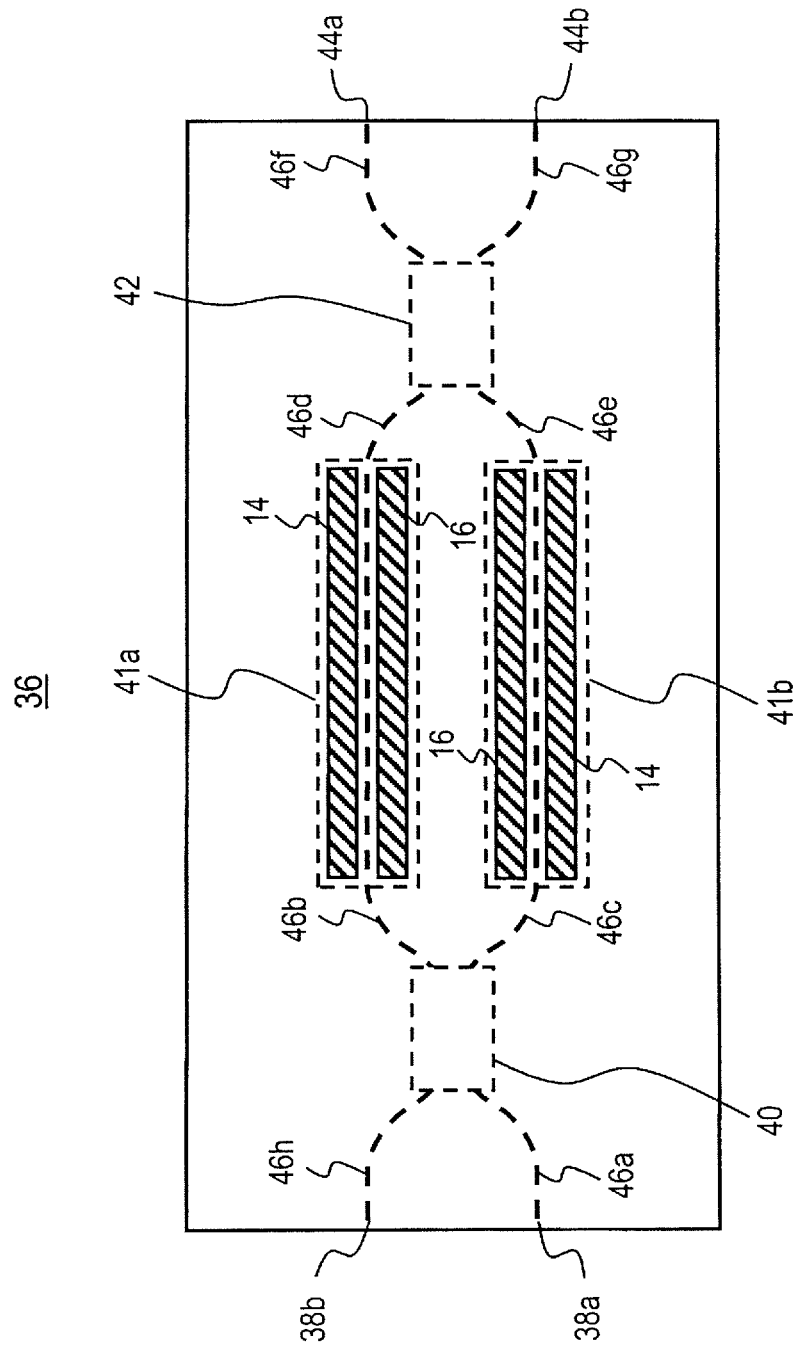
FIG. 7 is a plan view of an MZ optical switch according to the embodiment 1.

FIG. 7 is a plan view of an MZ optical switch 36 according to the present embodiment. As depicted in FIG. 7, the MZ optical switch 36 includes a first input port 38a, a second input port 38b and an optical branching device 40 for branching incident light into first branched light and second branched light. The optical branching device 40 is a 2-input 2-output multi-mode interference waveguide (MMI), as an example.

The MZ optical switch 36 also includes a first phase shifter portion 41a which the first branched light enters and a second phase shifter portion 41b which the second branched light enters. The lengths of the first phase shifter portion 41a and the second phase shifter portion 41b are substantially identical.

The first phase shifter portion 41a and the second phase shifter portion 41b are the phase shifter portion 2 explained by reference to FIG. 2. Namely, the first phase shifter portion 41a and the second phase shifter portion 41b are of substantially identical structures with substantially identical sizes. The same is applicable to other embodiments.

Further, the MZ optical switch 36 includes an optical coupler 42 for coupling the first branched light output from the first phase shifter portion 41a and the second branched light output from the second phase shifter portion 41b, so as to generate first coupled light and second coupled light. The optical coupler 42 is a 2-input 2-output multi-mode interference waveguide, as an example.

Also, the MZ optical switch 36 includes a first output port 44a for outputting the first coupled light and a second output port 44b for outputting the second coupled light. Further, the MZ optical switch 36 includes optical waveguides 46a-46h for connecting optical members like optical branching devices (i.e. optical branching device, phase shifter portion and optical coupler) or each optical member and the input port or the output port.

The cross section structures of the optical members (i.e. optical branching device, optical coupler and optical waveguide) other than the phase shifter portion are substantially identical to the structure of the phase shifter portion 2 explained by reference to FIG. 2. However, these optical members do not include any n-type region 14, p-type region 16, first external electrode 22a, second external electrode 22b, first connection conductor 24a and second connection conductor 24b. Each convex portion of the optical members on the first semiconductor layer 10 includes a width according to each function of the optical members.

Each device length of the first phase shifter portion 41a and the second phase shifter portion 41b is 0.1 mm, for example.

(3) Operation

Next, the operation of the MZ optical switch 36 will be described.

First, light enters at the first input port 38a and then propagates through the optical waveguide 46a, to reach the optical branching device 40. On reaching the optical branching device 40, the light is branched into the first branched light and the second branched light.

The first branched light and the second branched light propagate through the optical waveguides 46b, 46c, respectively, and reach the input ports of the first phase shifter portion 41a and the second phase shifter portion 41b.

After the phase of the first branched light is varied by the first phase shifter portion 41a, the light is output from the output port of the first phase shifter portion 41a. Here the phase of the first branched light is varied according to an input signal (electric signal) applied between the p-type region 16 and the n-type region 14.

On the other hand, the second branched light is given a constant phase variation by the second phase shifter portion 41b, thereafter the second branched light is output from the output port of the second phase shifter portion 41b.

The first branched light, the phase of which is varied according to the input signal, and the second branched light, to which the constant phase variation is given, respectively propagate through the optical waveguide 46d and the optical waveguide 46e, to reach the optical coupler 42.

After reaching the optical coupler 42, the first branched light and the second branched light are coupled to become first coupled light and second coupled light. The first coupled light propagates through the optical waveguide 46f, and is output from the first output port 44a. Also, the second coupled light propagates through the optical waveguide 46g, and is output from the second output port 44b.

When the input signal (electric signal) is applied between the p-type region 16 and the n-type region 14 of the first phase shifter portion 41a, the carrier density in the core 19 is varied, in response to the variation of the input signal. As a result, the refractive index of the core 19 is varied by plasma effect, so that the phase of the first branched light is varied according to the input signal.

On the other hand, when a constant voltage is applied between the p-type region 16 and the n-type region 14 of the second phase shifter portion 41b, carriers of a constant density are accumulated in the core 19 according to the applied voltage. As a result, the refractive index of the core 19 is varied by plasma effect, so that a constant phase variation is given to the second branched light. By the phase variation, a difference between the optical length of the propagation path of the first branched light (at the time when the input signal is not applied to the first phase shifter portion 41a) and the optical length of the second branched light becomes substantially coincident with zero (or an integral multiple of the wavelength of the propagating light).

Accordingly, in response to the variation of the electric signal applied to the first phase shifter portion 41a, the first coupled light and the second coupled light blink (turn on and off). If a phase difference between the first branched light and the second branched light is 0 rad (or an even multiple of n rad) when the first branched light and the second branched light enter the optical coupler 42, the first coupled light is switched on. If a phase difference between the first branched light and the second branched light is n rad (or an odd multiple of n rad), the second coupled light is switched on.

In other words, in response to the input signals applied to the first phase shifter portion 41a, the light entering at the first input port 38a is output from either the first output port 44a or the second output port 44b.

As described above, carrier densities in the first phase shifter portion 41a and the second phase shifter portion 41b are greatly higher than the carrier density in the homojunction phase shifter portion 2a. Therefore, the power consumption of the MZ optical switch 36 according to the present embodiment is exceedingly smaller than the power consumption of the homojunction MZ optical switch. Alternatively, when the phase variation of the propagating light is adjusted by the length of the phase shifter portion, instead of the power consumption, the device length to obtain a desired phase difference becomes shorter.

Figure 8:
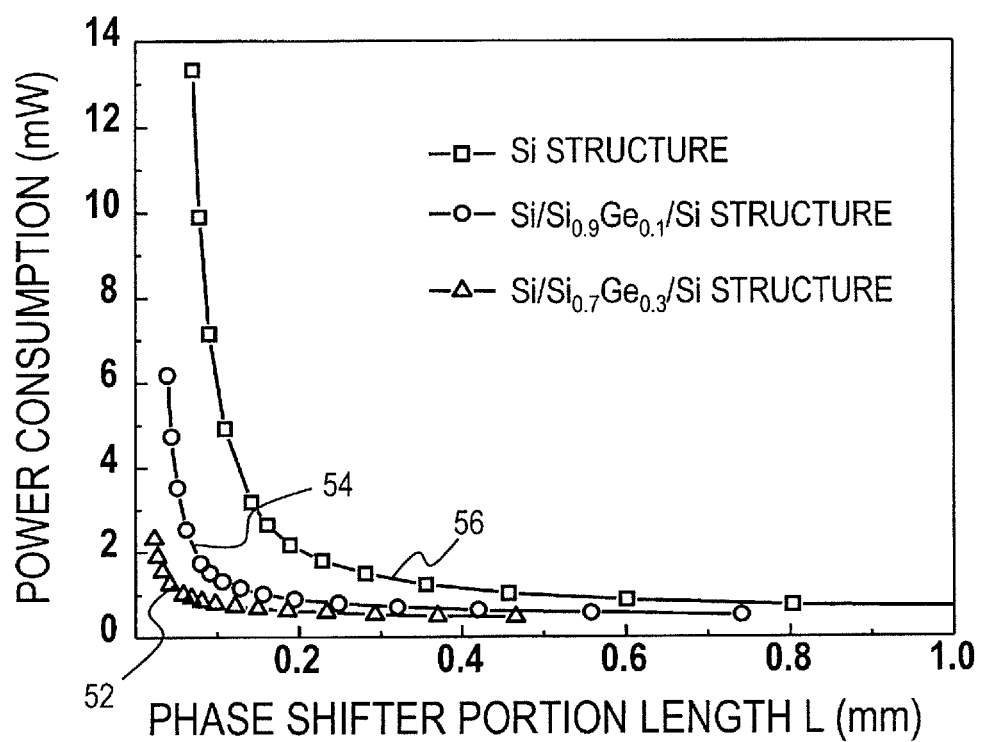
FIG. 8 is a diagram depicting relationships between the length L of the first phase shifter portion and the second phase shifter portion and power consumption to switch off output light (first coupled light)

FIG. 8 is a diagram depicting relationships between the length L of the first phase shifter portion 41a and the second phase shifter portion 41b and power consumption to switch off output light (for example, first coupled light). The horizontal axis denotes length L of the first phase shifter portion 41a. The vertical axis denotes power consumption to switch off the output light. Data for FIG. 8 are obtained by carrier density obtained by the simulation of FIG. 6 and expression (1).

$$\Delta n = -(e^2\lambda^2/8\pi^2c^2\epsilon_0 n)\cdot[\Delta N_e/m^*_{ce}+\Delta N_h/m^*_{ch}] \quad (1)$$

where $\Delta n$ is the variation of refractive index by plasma effect, $\Delta N_e$ and $\Delta N_h$ are electron density and hole density, respectively, e is elemental charge, c is light velocity, $\epsilon_0$ is dielectric constant of vacuum, $\lambda$ is wavelength, n is refractive index, and $m^*_{ce}$ and $m^*_{ch}$ are the effective mass of electron and hole, respectively.

In FIG. 8, a first curve 52 and a second curve 54 depict relationships when the second semiconductor layer 12 is the $Si_{0.7}Ge_{0.3}$ layer and the $Si_{0.9}Ge_{0.1}$ layer, respectively. In addition, a third curve 56 depicts the relationship of the homojunction MZ optical switch.

As depicted in FIG. 8, on condition that the length L of the first phase shifter portion 41a is identical, the power consumption of the MZ optical switch 36 according to the present embodiment is exceedingly smaller than that of the homojunction MZ optical switch.

For example, when the length of the first phase shifter portion 41a is 0.1 mm, power consumption of the homojunction MZ optical switch using the silicon core is 6.8 mW. In contrast, power consumption of the MZ optical switch 36, having the second semiconductor layer 12 formed of the $Si_{0.7}Ge_{0.3}$ layer, is 0.9 mW. That is, according to the MZ optical switch 36 of the present embodiment, the power consumption is reduced by 85%. Also, in the case of the MZ optical switch 36 having the second semiconductor layer 12 formed of the $Si_{0.9}Ge_{0.1}$ layer, the power consumption becomes smaller than in the homojunction device.

Concerning the homojunction MZ optical switch, as depicted in FIG. 8, the power consumption abruptly increases when the length L of the phase shifter portion is 0.2 mm or smaller. Therefore, concerning the homojunction MZ optical switch, it is not preferable to make the length L of the phase shifter portion 0.2 mm or smaller. On the other hand, concerning the MZ optical switch 36 according to the present embodiment, the power consumption is substantially constant if the length L of the phase shifter portion is decreased to around 0.02-0.04 mm, as depicted in FIG. 8. Thus, according to the present embodiment, it is possible to shorten the device length of the MZ optical switch.

Figure 9:
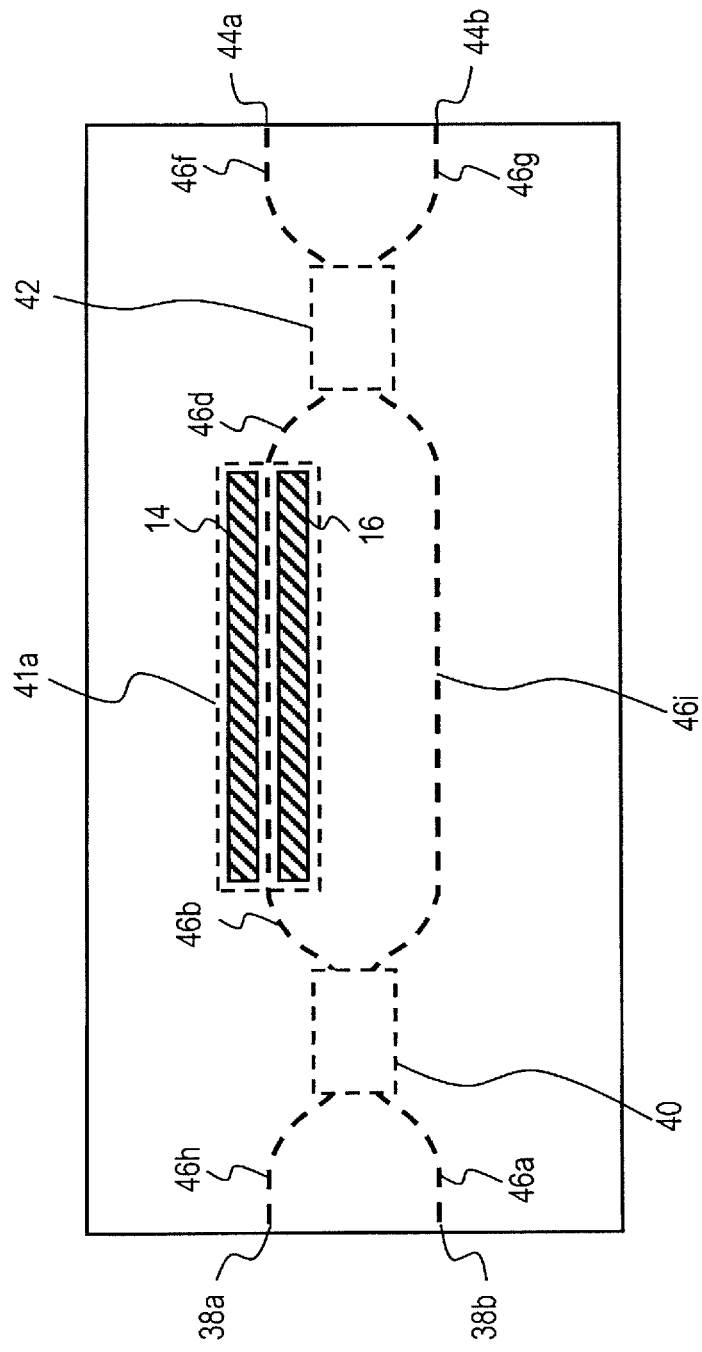
FIG. 9 is a diagram depicting a deformed example of the embodiment 1.

FIG. 9 is a diagram depicting a deformed example of the present embodiment. The MZ optical switch 36 depicted in FIG. 7 includes two phase shifter portions. However, as depicted in FIG. 9, the second phase shifter portion 41b may be omitted and instead an optical waveguide 46i may be provided as an optical path of the second branched light.

In the present device, by superposing a constant voltage to the input signal to be applied to the first phase shifter portion 41a, a difference between the optical lengths of the propagation paths of the first branched light and the second branched light is made substantially zero (or an integral multiple of the propagating light wavelength).

Now, a region having the smallest band gap in the phase shifter portion 2 is the second semiconductor layer 12. Therefore, the lower limit of the operating wavelength of the phase shifter portion 2 is a wavelength corresponding to the band gap of the second semiconductor layer 12.

Figure 10:
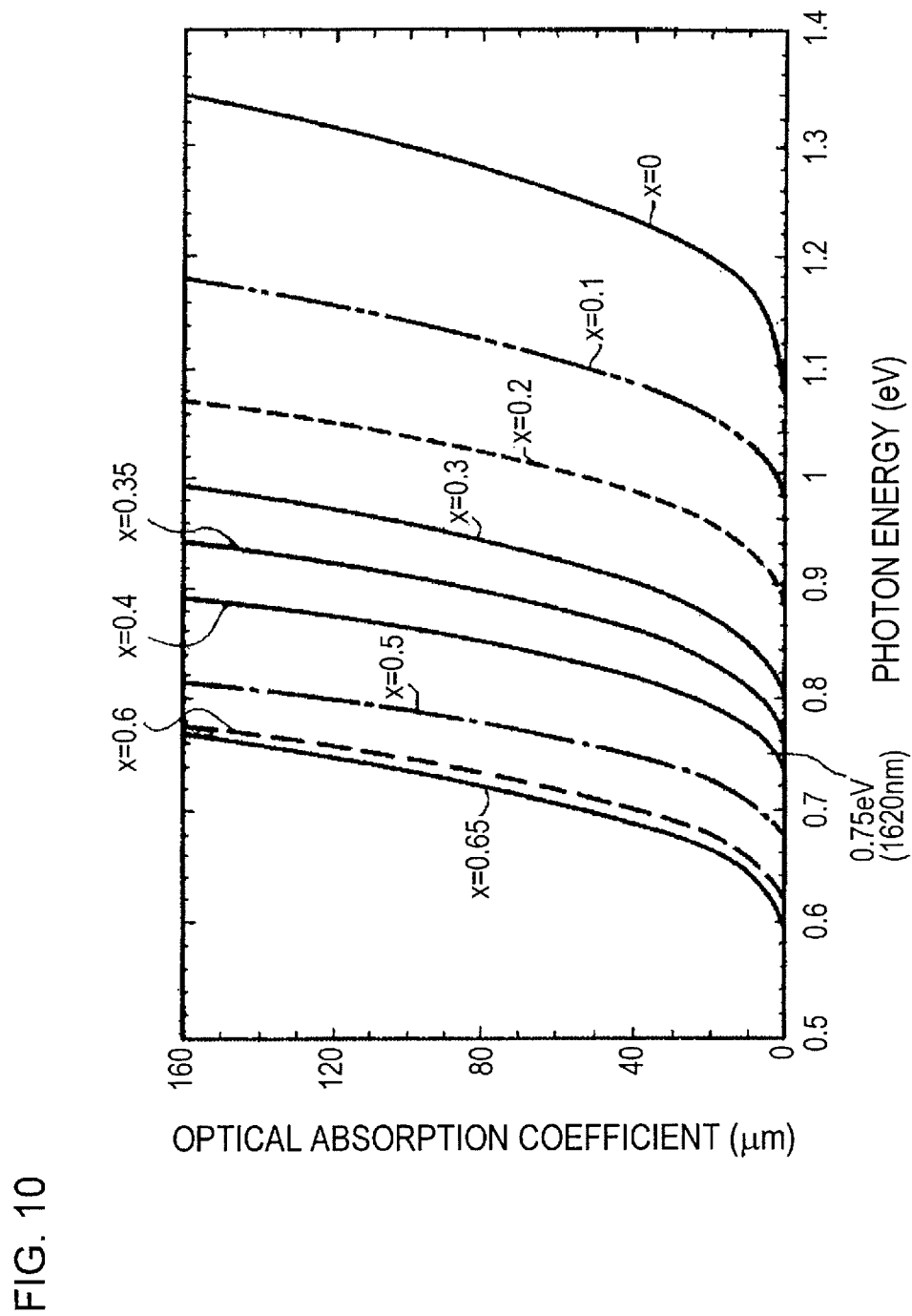
FIG. 10 is a diagram depicting relationships between the incident light energy of a $Si_{1-x}Ge_x$ layer grown on the Si substrate and optical absorption coefficient.

FIG. 10 is a diagram depicting relationships between the incident light energy of a $Si_{1-x}Ge_x$ layer grown on the Si substrate and optical absorption coefficient (L. Naval, R. Jalali, L. Gomelsky, and J. M. Liu, "Optimization of $Si_{1-x}Ge_x$/Si Waveguide Photodetectors Operating at 1.3 um", Journal of Lightwave Technology, Vol. 14, pp. 787-797, 1996.). The horizontal axis denotes the incident light energy (photon energy). The vertical axis denotes the optical absorption coefficient. Each parameters x in FIG. 10 denotes a Ge composition ratio.

The MZ optical switch 36 of the present embodiment is applicable to a transmitter or a receiver for optical communication, for example. The upper limit of wavelengths to be used in optical communication is 1620 nm (upper-limit wavelength in the L band). As depicted in FIG. 10, when the Ge composition ratio x is 0.35 or smaller, the absorption edge of $Si_{1-x}Ge_x$ is shorter than the above upper-limit wavelength 1620 nm (0.75 eV). Therefore, when the optical switch according to the present embodiment is used for optical communication, preferably the Ge composition ratio x of the second semiconductor layer 12 is 0.35 or smaller (and greater than 0). The same is applicable to the embodiments described below.

As the SiGe layer depicted in FIG. 10, the SiGe layer grown on the Si layer is distorted by compressive stress. The band gap of such a SiGe layer varies depending on the plane direction of the Si layer. However the variation thereof is small and the relationships depicted in FIG. 10 are maintained substantially constant, independent of the plane direction of the Si layer. Therefore, preferably the Ge composition ratio x of the second semiconductor layer 12 is in the range of 0.35 or smaller (and greater than 0), independent of the plane direction of the first semiconductor layer 10.

However, the power consumption in the phase shifter portion 2 varies depending on the plane direction of the first semiconductor layer 10. When the SiGe layer is epitaxially grown on a (110) Si layer, a band offset $\Delta E_C$ on the conduction band edge increases (Chris G. Van de Walle and Richard M. Martin, "Theoretical calculations of heterojunction discontinuities in the Si/Ge system", Vol. 34, pp. 5621-5633, 1986.). For example, $\Delta E_C$ of the Si layer and the $Si_{0.7}Ge_{0.3}$ layer is 0.03 eV when the plane direction of the Si layer (and the $Si_{0.7}Ge_{0.3}$ layer) is (100). In contrast, $\Delta E_C$ is 0.07 eV when the plane direction of the Si layer is (110). As such, by changing the plane direction of the Si layer from (100) to (110), $\Delta E_C$ is increased by approximately 0.04 eV. As a result, the carrier density in the second semiconductor layer 12 is increased and the power consumption in the phase shifter portion 2 is decreased accordingly.

Such a second semiconductor layer (SiGe layer) 12 in the phase shifter portion 2 is a semiconductor layer epitaxially grown on the first semiconductor layer (Si layer) 10. Therefore, both the first semiconductor layer 10 and the second semiconductor layer 12 have a (110) plane direction. The same is applicable to the third semiconductor layer 13.

(4) Manufacturing Method

FIGS. 11A to 13C are process cross-sectional views illustrating the manufacturing method of the MZ optical switch 36 according to the present embodiment.

Figure 11A:
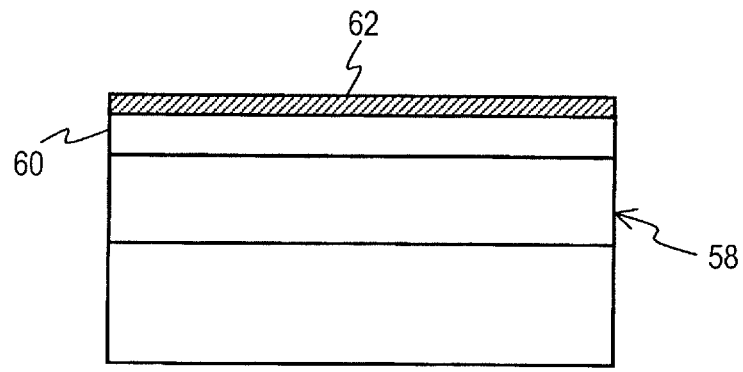
FIGS. 11A-11C are process cross-sectional views illustrating the manufacturing method of the MZ optical switch according to the embodiment 1.

First, as depicted in FIG. 11A, an SOI (Silicon on Insulator) substrate 58 of a wafer shape is prepared.

Figure 11B:
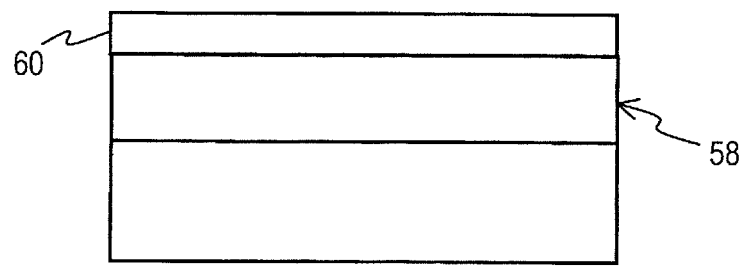
Figure 11C:
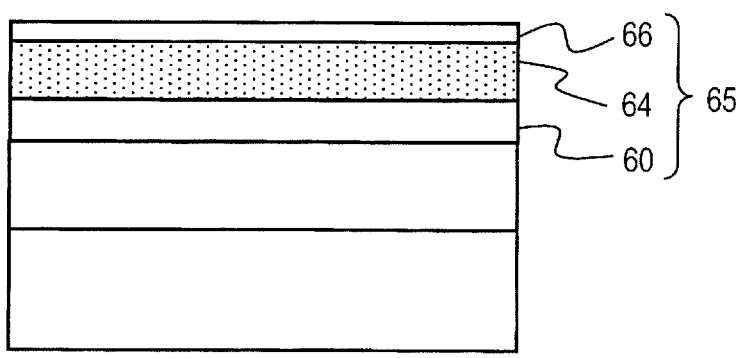

Next, as depicted in FIG. 11B, a native oxide film 62 which covers a Si layer 60 of the SOI substrate 58 is removed. On the Si layer 60, a SiGe layer 64 and a Si layer 66 are epitaxially grown by, for example, MOVPE (Metal Organic Vapor Epitaxial Growth), as depicted in FIG. 11C.

By the epitaxial growth, a laminate film 65 including the Si layer 60, the SiGe layer 64 and the Si layer 66 is formed. The Si layer 60 of the laminate film 65 becomes the first semiconductor layer 10. The SiGe layer 64 becomes the second semiconductor layer 12. Also, the Si layer 66 becomes the third semiconductor layer 13.

Figure 12A:
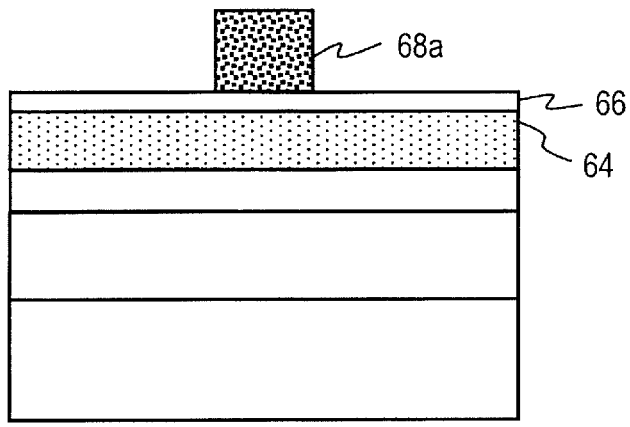
FIGS. 12A-12C are process cross-sectional views illustrating the manufacturing method of the MZ optical switch according to the embodiment 1.
Figure 12B:
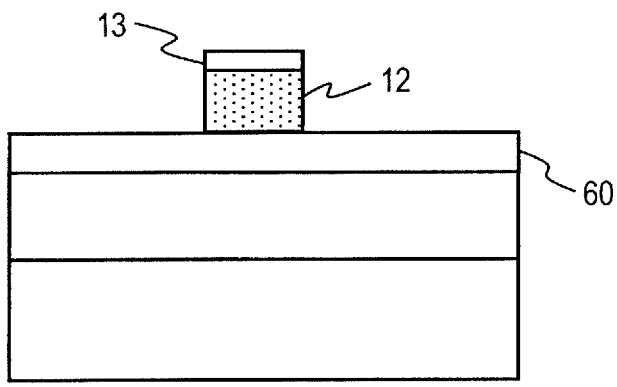

Next, as depicted in FIG. 12A, a photoresist film 68a corresponding to each protrusion portion (convex portion of the phase shifter portion etc.) of optical members (optical branching device 40, phase shifter portions 41a, 41b, optical coupler 42 and optical waveguides 46a-46h) is formed on the Si layer 66. Thereafter, as depicted in FIG. 12B, using the photoresist film 68a as a mask, the Si layer 66 and the SiGe layer 64 are dry etched. By the dry etching, the stripe-shaped third semiconductor layer 13 (Si layer) and the stripe-shaped second semiconductor layer 12 (SiGe layer) are formed.

Figure 12C:
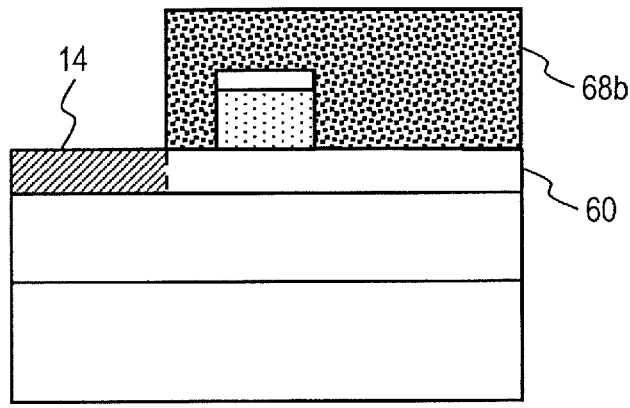

Next, as depicted in FIG. 12C, a photoresist film 68b, which includes an aperture portion at the formation position of the n-type region 14, is formed. Thereafter, using the photoresist film 68b as a mask, an n-type dopant (for example, phosphorus) is ion-implanted into the Si layer 60.

Next, after the photoresist film 68b is removed, a photoresist film 68c including an aperture portion at the formation position of the p-type region 16 is formed. Then, using the photoresist film 68c as a mask, a p-type dopant (for example, boron) is ion-implanted into the Si layer 60. Thereafter, the photoresist film 68c is removed, and heat treatment is performed to activate impurities. By the heat treatment, the ion-implanted impurities are activated. Thus, the n-type region 14 and the p-type region 16 are formed.

Next, on the surface of the optical waveguide layer 8 including the first semiconductor layer 10, the second semiconductor layer 12 and the third semiconductor layer 13, a $SiO_2$ film 70 is deposited by the CVD (Chemical Vapor Deposition) method, for example. The $SiO_2$ film 70 becomes the second clad layer 6.

Next, by etching the $SiO_2$ film 70 at the formation position of the connection conductors 24a, 24b, contact holes are formed. On the $SiO_2$ film 70, a conductor film (for example, metal film) is deposited, and thereafter, the conductor film outside the contact holes is removed. By this, the connection conductors 24a, 24b are formed.

Figure 13A:
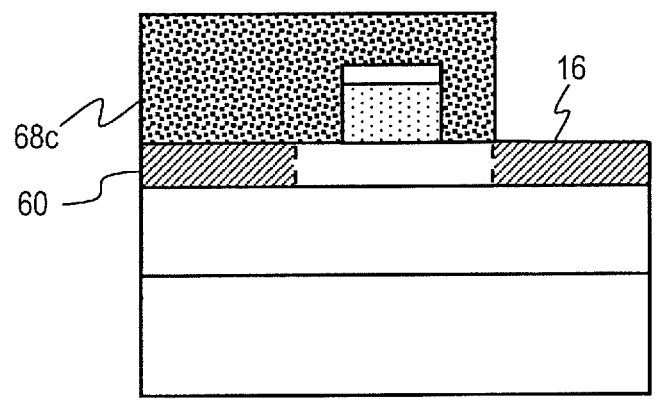
FIGS. 13A-13C are process cross-sectional views illustrating the manufacturing method of the MZ optical switch according to the embodiment 1.
Figure 13B:
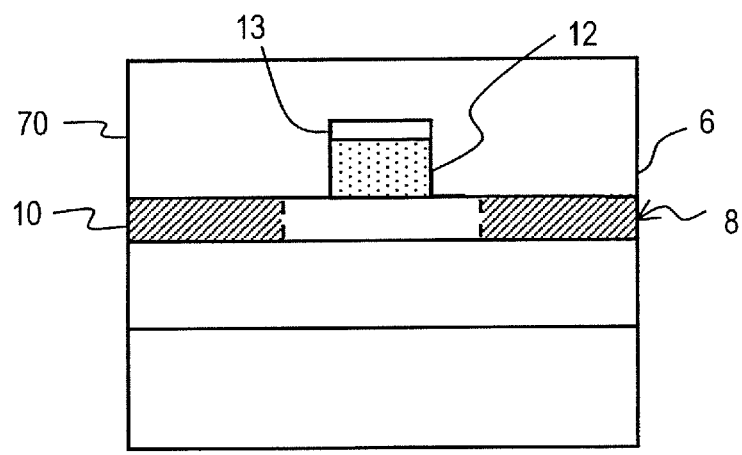
Figure 13C:
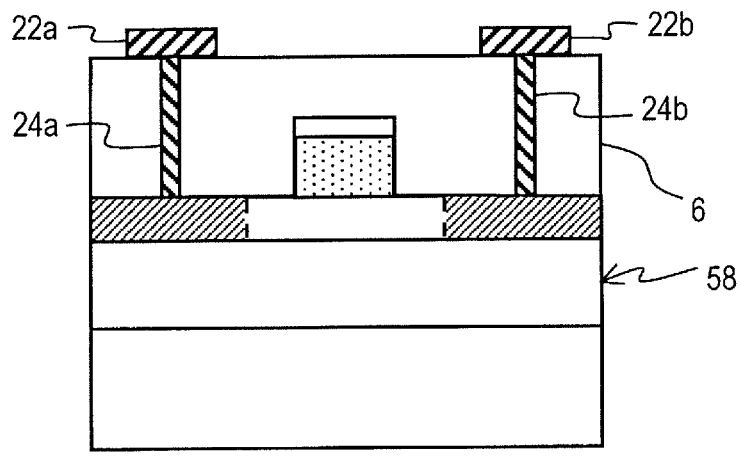

On the $SiO_2$ film 70, a conductor film is deposited further, so that the first external electrode 22a and the second external electrode 22b are formed, as depicted in FIG. 13C.

Thereafter, the SOI substrate 58 is divided to form the chip-shaped MZ optical switch 36.

Figure 14:
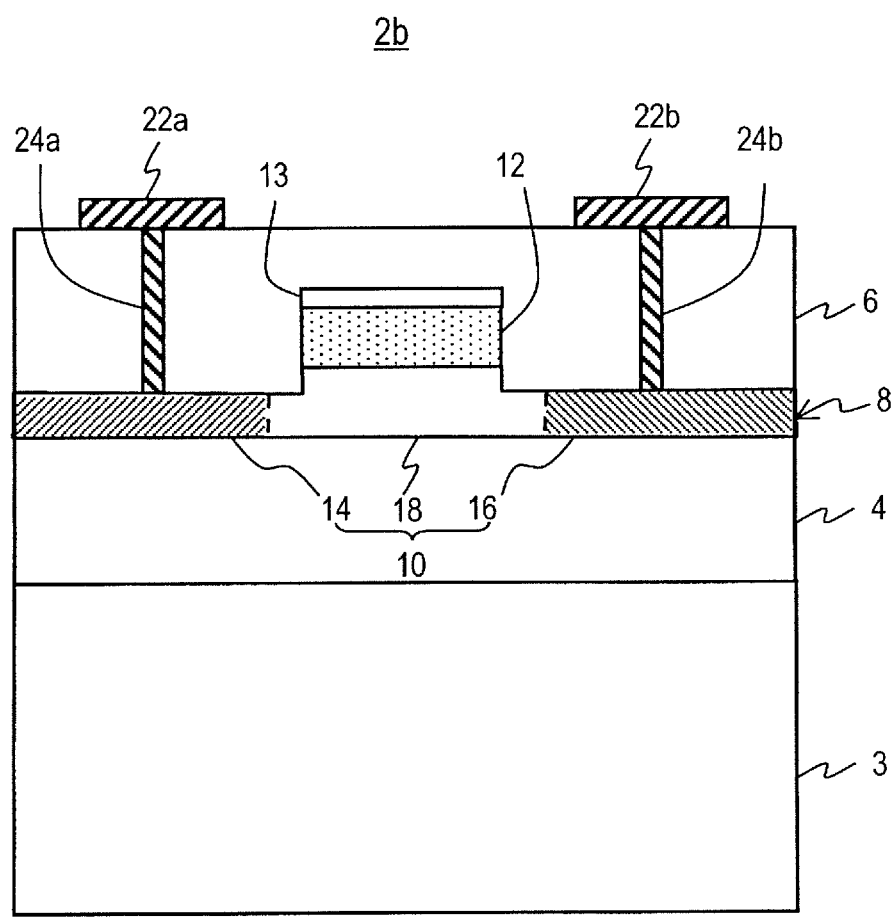
FIG. 14 is a cross-sectional view of a phase shifter portion formed by over-etching.

In the above-mentioned manufacturing method, as depicted in FIG. 12B, dry etching is stopped immediately after the completion of etching the SiGe layer 64. Here, the etching may be continued for a while after the completion of etching the SiGe layer 64 so that uneven etching does not occur. FIG. 14 depicts a cross-sectional view of a phase shifter portion 2b formed by such over-etching.

In the above phase shifter portion 2b, on both sides of the second semiconductor layer (SiGe layer) 12, the first semiconductor layer (Si layer) 10 is thinner than a region thereof contacting to the second semiconductor layer 12, as depicted in FIG. 14. With such a structure, the power consumption of the MZ optical switch is also reduced because carriers are confined in the second semiconductor layer 12, similar to the phase shifter portion 2 depicted in FIG. 2.

(5) Deformed Example of Phase Shifter Portion

Figure 15:
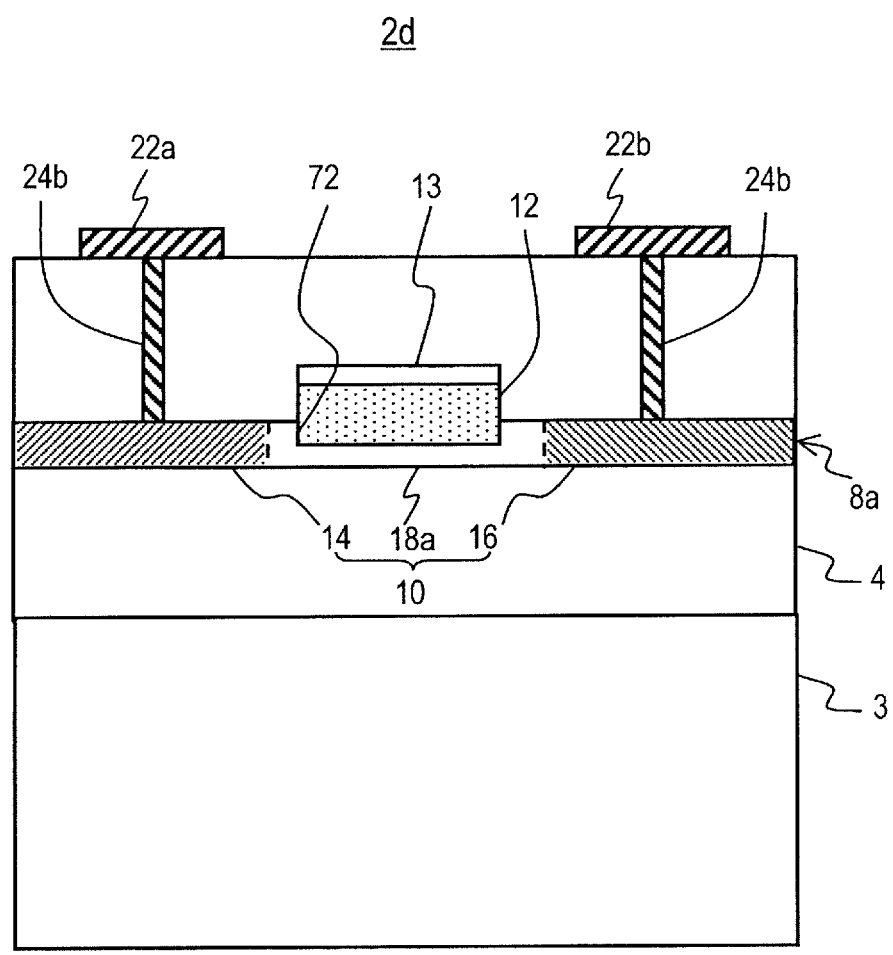
FIG. 15 is a cross-sectional view illustrating a deformed example of the phase shifter portion.

FIG. 15 is a cross-sectional view illustrating a deformed example 2d of the phase shifter portion 2. This phase shifter portion 2d includes a groove 72 disposed in an i-type region 18a of the optical waveguide layer 8a. The second semiconductor layer 12 is provided on the groove 72, so that at least a portion of the side faces of the second semiconductor layer 12 contacts to the i-type region 18a.

Carriers supplied from the n-type region 14 and the p-type region 16 are injected also from the side faces of the second semiconductor layer 12. By this, in the second semiconductor layer 12, there are accumulated a larger quantity of carriers than in the case of the phase shifter portion 2 illustrated by reference to FIG. 2. Therefore, according to the phase shifter portion 2d depicted in FIG. 15, it is possible to reduce the power consumption of the MZ optical switch 36 further. Alternatively, it is possible to shorten the length of the MZ optical switch 36 further.

The phase shifter portion 2d may be manufactured by forming in advance the groove 72 on the Si layer of the SOI substrate. Except for the use of such a substrate, the manufacturing method of the phase shifter portion 2d is substantially identical to the manufacturing method illustrated by reference to FIGS. 11A through 13C.

Additionally, the first semiconductor layer 10 may be thicken on both sides of the second semiconductor layer 12, so that the entire side faces of the second semiconductor layer 12 contact to the first semiconductor layer 10. Even with such a structure, incident light propagates through the second semiconductor layer 12 because the refractive index of the second semiconductor layer 12 is higher than the first semiconductor layer 10.

Now, in the phase shifter portion 2, the second semiconductor layer 12 is disposed slightly apart from the n-type region 14 and the p-type region 16 sides, as depicted in FIG. 2. By this, it is possible to suppress the attenuation of propagating light caused by the carriers in the n-type region 14 and the p-type region 16. However, when such attenuation is not a problematic matter, the second semiconductor layer 12 and the n-type region 14 may contact to each other. Similarly, the second semiconductor layer 12 and the p-type region 16 may also contact to each other.

Carrier densities in the n-type region 14 and the p-type region 16 used in the simulations of FIGS. 6 and 8 are $1 \times 10^{19}$ $cm^{-3}$. However, the carrier densities in the n-type region 14 and the p-type region 16 are not limited to have such a value. For example, the carrier densities in the n-type region 14 and the p-type region 16 may be $1 \times 10^{18}$ $cm^{-3}$ to $1 \times 10^{21}$ $cm^{-3}$. Or alternatively, the carrier densities in the n-type region 14 and the p-type region 16 may also be $1 \times 10^{19}$ $cm^{-3}$ to $1 \times 10^{20}$ $cm^{-3}$.

Further, in the simulations of FIGS. 6 and 8, it is assumed that the carrier density in the i-type region 18 is an intrinsic carrier density. However, the i-type region 18 may have a carrier density to such an extent that the attenuation of the propagating light does not cause a problem. For example, the carrier density in the i-type region 18 may be $1 \times 10^{10}$ $cm^{-3}$ to $1\times10^{17}$ cm$^{-3}$. Alternatively, the carrier density in the i-type region 18 may be $1\times10^{12}$ cm$^{-3}$ to $1\times10^{15}$ cm$^{-3}$.

Further, the sizes of the semiconductor layers used in the simulations of FIGS. 6 and 8 are one example. The sizes of the semiconductor layers may be different from the sizes used in the simulations. The same is applicable to the device length. However, preferably the thickness of the second semiconductor layer 12 is a critical film thickness or smaller. Here, the critical film thickness is a film thickness which produces misfit dislocation in a growth layer when hetero-epitaxial growth is performed. In the case a film thickness is the critical film thickness or smaller, the possibility of the generation of misfit dislocation is small. For example, when the first semiconductor layer 10 is a Si layer and the second semiconductor layer 12 is a $Si_{1-x}Ge_x$ layer ($0<x\leq0.3$), preferably the thickness of the second semiconductor layer 12 is 400 nm or less.

(Embodiment 2)

A semiconductor optical device according to the present embodiment is a gate optical switch.

(1) Structure

The structure of the gate optical switch according to the present embodiment is substantially identical to that of the phase shifter portion 2 according to the embodiment 1, except for a large device length. The device length of the phase shifter portion 2 according to the embodiment 1 is 0.1 mm, for example. In contrast, the device length of the gate optical switch according to the present embodiment is 1 mm, for example. The plan view and the cross-sectional view of the gate optical switch according to the present embodiment 2 are substantially identical to FIGS. 1 and 2, respectively.

Figure 16:
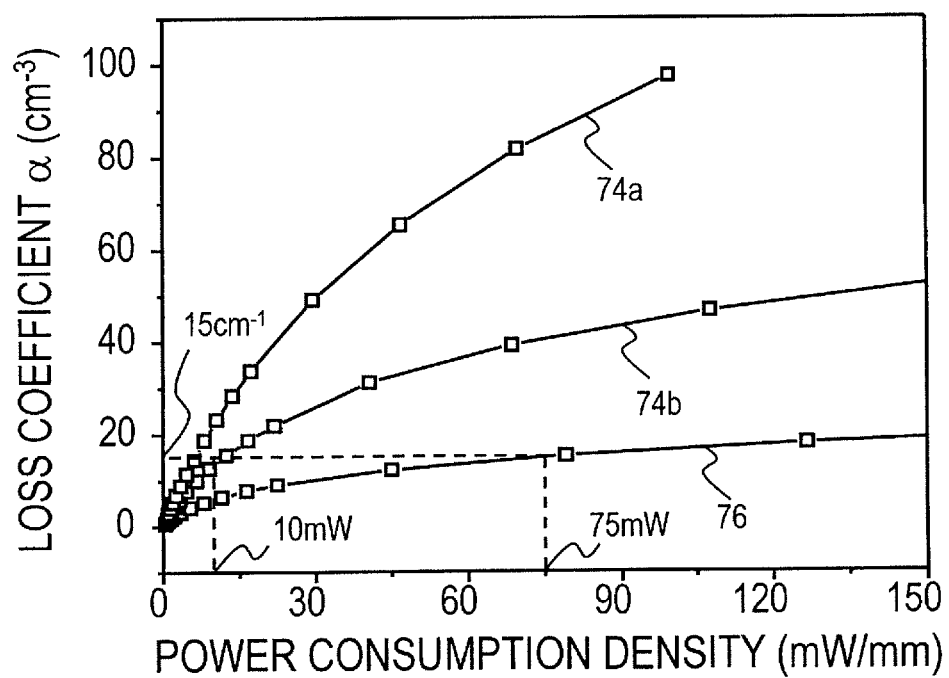
FIG. 16 is a diagram depicting relationships between a power consumption density of the gate optical switch according to the embodiment 2 and a loss coefficient α of the core.

FIG. 16 is a diagram depicting relationships between a power consumption density of the gate optical switch according to the present embodiment and a loss coefficient α of the core 19. The horizontal axis denotes the power consumption density. The vertical axis denotes the loss coefficient of the core.

The loss coefficient α is obtained based on the carrier density in each semiconductor layer obtained from the simulation of FIG. 6 and expression (2).

$$\Delta\alpha=(e^3\lambda^2/4\pi^2c^3\epsilon_0 n)\cdot[\Delta N_e/m^*_{ce}\mu_e+\Delta N_h/m^*_{ch}\mu_h] \quad (2)$$

where Δα is the increment of loss coefficient by plasma effect, $\Delta N_e$ is the increment of electron density by carrier injection, $\Delta N_h$ is the increment of hole density by carrier injection, λ is wavelength, n is refractive index, e is elemental charge, c is light velocity, $\epsilon_0$ is dielectric constant of vacuum, $m^*_{ce}$ and $m^*_{ch}$ are the effective mass of electron and hole, respectively, $\mu_e$ is electron mobility, and $\mu_h$ is hole mobility.

The waveguide scattering loss of the gate optical switch according to the present embodiment is a few cm$^{-1}$ at the highest. Therefore, in the simulation depicted in FIG. 16, the waveguide scattering loss is neglected.

In FIG. 16, there are depicted the loss coefficient of the gate optical switch in which the Ge composition ratio of the second semiconductor layer 12 is 0.3 (first curve 74a), and the loss coefficient of the gate optical switch in which the Ge composition ratio of the second semiconductor layer 12 is 0.1 (second curve 74b). Further, in FIG. 16, the loss coefficient of the gate optical switch using a silicon core (hereafter referred to as homojunction gate optical switch) is also depicted (curve 76). The dimension etc. of a model used in the simulation of FIG. 16 are identical to the dimension etc. of the model used in the simulation of FIG. 6, except for the device length.

As depicted in FIG. 16, according to the gate optical switch in the present embodiment, the power consumption thereof is greatly reduced as compared to that of the homojunction gate optical switch. Concerning the homojunction gate optical switch, for example, the power consumption where the loss coefficient α becomes 15 cm$^{-1}$ is 75 mW (refer to the curve 76). On the other hand, power consumption of the gate optical switch according to the present embodiment is around 10 mW (refer to the first curve 74a and the second curve 74b). That is, according to the present embodiment, the power consumption is reduced by around 87%.

As such, the power consumption of the gate optical switch according to the present embodiment is exceedingly smaller than the power consumption of the homojunction gate optical switch. Or alternatively, when the attenuation of the propagating light is adjusted by the length of the gate optical switch, instead of the power consumption, the device length to obtain a desired attenuation is shortened.

(2) Operation

Next, the operation of the gate optical switch according to the present embodiment will be described. First, signal light (light modulated according to information) enters at an input port 48 and propagates in the core 19 (refer to FIGS. 1 and 2). In this state, an input signal (electric signal) is applied to a p-i-n junction including the n-type region 14, the i-type region 18 and the p-type region 16, through the external electrodes 22a, 22b.

By this, carriers are supplied from the n-type region 14 and the p-type region 16 to the core 19. The supplied carriers are accumulated in the second semiconductor layer 12, so that the propagating light is absorbed by the plasma effect.

Therefore, during a period when the input signal is ON, the signal light is hardly output from the output port 50. On the other hand, during a period when the input signal is OFF, the signal light is output from the output port 50 with little attenuation. Namely, in response to the electric signals, the gate optical switch switches the signal light ON/OFF.

The gate optical switch according to the present embodiment is a semiconductor device for passing or intercepting signal light. However, the gate optical switch according to the present embodiment may also be used as another semiconductor optical device.

For example, let light having constant light intensity be input to the gate optical switch, and an electric signal corresponding to desired information be applied between the p-type region 16 and the n-type region 14. Then, the input light intensity is varied in response to the input signal.

That is, the gate optical switch according to the present embodiment may also be used as an optical modulator. Or alternatively, the gate optical switch according to the present embodiment may be used as a variable optical attenuator. The same is applicable to optical switches according to other embodiments (including the embodiment 1).

(Embodiment 3)

A semiconductor optical device according to the present embodiment has a substantially identical structure to the MZ optical switch of the embodiment 1. However, in the semiconductor optical device according to the present embodiment, the band gap of the second semiconductor layer 12 and the thickness of the third semiconductor layer 13 are set to be preferable values. Hereafter, the description of portions common to the embodiment 1 will be omitted.

(1) Band Gap of the Second Semiconductor Layer

First, an influence of the third semiconductor layer 13 upon the characteristics of the MZ optical switch will be described.

Figure 17:
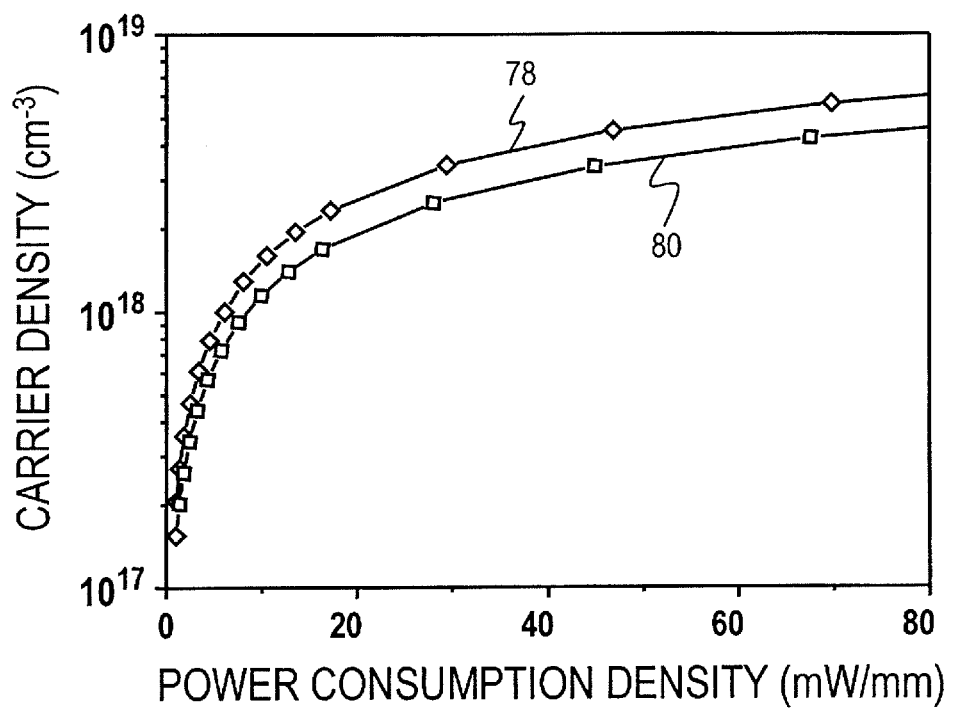
FIG. 17 is a diagram depicting a relationship between a power consumption density of a phase shifter portion according to the embodiment 3 and a carrier density in the second semiconductor layer.

FIG. 17 is a diagram depicting a relationship between a power consumption density of a phase shifter portion (hereafter referred to as Si/SiGe phase shifter portion) 2 according to the present embodiment and a carrier density in the second semiconductor layer 12 (first curve 78). The horizontal axis denotes the power consumption density. The vertical axis denotes the carrier density.

The model of the Si/SiGe phase shifter portion used in the simulation of the first curve 78 has a substantially identical structure to the model used in the simulation of FIG. 6. The Ge composition ratio of the second semiconductor layer 12 is 0.3.

FIG. 17 also depicts a relationship (second curve 80) between a power consumption density of a phase shifter portion (hereafter referred to as SiGe phase shifter portion), in which the third semiconductor layer 13 is not included, and a carrier density in a SiGe layer.

The SiGe layer in the model of the SiGe phase shifter portion is of an identical size to the convex portion (laminate structure of the second semiconductor layer 12 and the third semiconductor layer 13) included in the model of the Si/SiGe phase shifter portion. In regard to portions other than the convex portion, the model structure of the SiGe phase shifter portion is identical to the model structure of the Si/SiGe phase shifter portion.

As depicted in FIG. 17, a carrier density 78 in the Si/SiGe phase shifter portion 2 (carrier density in the second semiconductor layer 12) is approximately 1.3 times larger than a carrier density 80 in the SiGe phase shifter portion (carrier density in the SiGe layer).

The second semiconductor layer (SiGe layer) 12 of the Si/SiGe phase shifter portion 2 is thinner than the SiGe layer of the SiGe phase shifter portion by the thickness of the third semiconductor layer 13. Carriers are concentrated in the thin second semiconductor layer 12, so that the carrier density in the second semiconductor layer 12 is increased.

As a result, the carrier density 78 in the Si/SiGe phase shifter portion (carrier density in the second semiconductor layer 12) becomes higher than the carrier density 80 in the SiGe phase shifter portion (carrier density in the SiGe layer), as depicted in FIG. 17.

Figure 18:
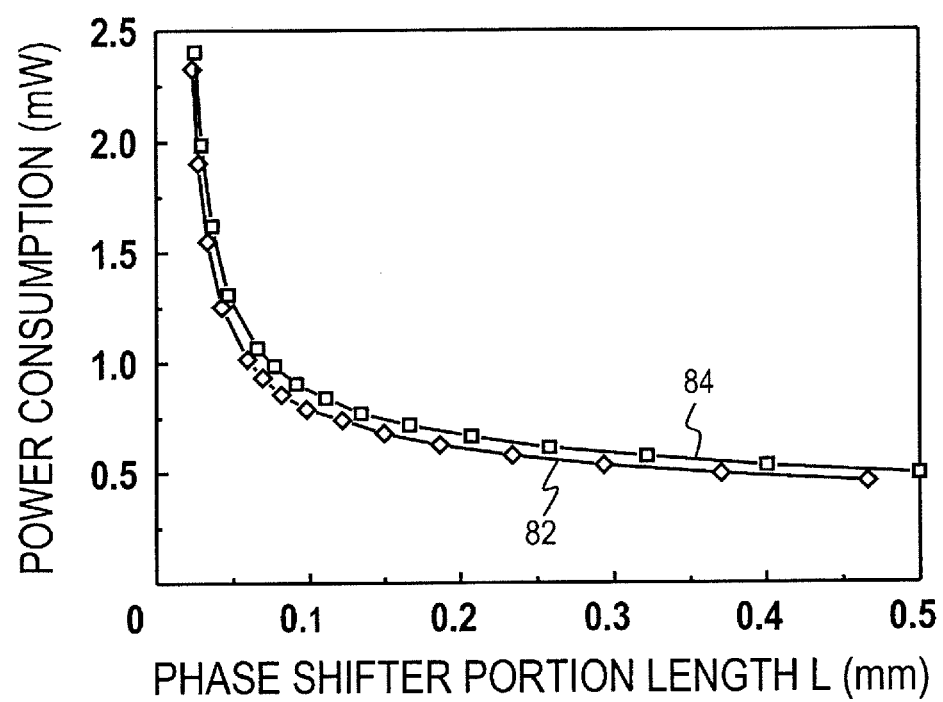
FIG. 18 is a diagram depicting a relationship between a length L of the phase shifter portion and power consumption to switch off the output light of the MZ optical switch.

FIG. 18 is a diagram depicting a relationship between a length L of the phase shifter portion and power consumption to switch off the output light of the MZ optical switch. The horizontal axis denotes the length L of the phase shifter portion. The vertical axis denotes the power consumption to switch off the output light of the MZ optical switch.

A first curve 82 depicts the relationship between the length L of the Si/SiGe phase shifter portion 2 and the power consumption to switch off the output light of the MZ optical switch which includes the Si/SiGe phase shifter portion (hereafter referred to as Si/SiGe optical switch). In FIG. 18, there is also depicted a curve 84 depicting a relationship between the length L of the SiGe phase shifter portion and the power consumption to switch off the output light of the MZ optical switch (hereafter referred to as SiGe optical switch) which includes the SiGe phase shifter portion. The simulation model is identical to the model of FIG. 17.

As depicted in FIG. 18, power consumption 82 of the Si/SiGe optical switch is around 10% lower than power consumption 84 of the SiGe optical switch. The reason is that the carrier density in the Si/SiGe phase shifter portion 2 is higher than the carrier density in the SiGe phase shifter portion, as depicted in FIG. 17.

When carriers are injected into the core of the phase shifter portion, an equivalent refractive index of the core is varied by the carriers accumulated in the core. The output light of the MZ optical switch is switched off when the variation of the equivalent refractive index (hereafter referred to as equivalent refractive index variation) reaches a certain value.

As depicted in FIG. 17, the carrier density 78 accumulated in the Si/SiGe phase shifter portion 2 is higher than the carrier density 80 accumulated in the SiGe phase shifter portion. Consequently, the absolute value of the equivalent refractive index variation (<0) in the Si/SiGe phase shifter portion 2 is larger than the absolute value of the equivalent refractive index variation in the SiGe phase shifter portion. Accordingly, power consumption to switch off the Si/SiGe optical switch is smaller than power consumption to switch off the SiGe optical switch.

However, when carriers are not sufficiently accumulated in the second semiconductor layer 12, there are cases that the power consumption to switch off the Si/SiGe optical switch may be increased by providing the third semiconductor layer 13.

An equivalent refractive index $n_{eq}$ of the core 19 in the phase shifter portion 2 is approximated by expression (3).

$$n_{eq} = n_{Si} \times \Gamma_{Si} + n_{SiGe} \times \Gamma_{SiGe} \quad (3)$$

where $n_{Si}$ is the refractive index of the first semiconductor layer (Si layer) 10 and the third semiconductor layer (Si layer) 13, $\Gamma_{Si}$ is the sum of the optical confinement coefficients of the first semiconductor layer 10 and the third semiconductor layer 13, $n_{SiGe}$ is the refractive index of the second semiconductor layer (SiGe layer) 12, and $\Gamma_{SiGe}$ is the optical confinement coefficient of the second semiconductor layer 12.

As is apparent from expression (3), an equivalent refractive index variation $\Delta n_{eq}$ produced by carrier injection (current injection) is represented by expression (4).

$$\Delta n_{eq} = \Delta n_{Si} \times \Gamma_{Si} + \Delta n_{SiGe} \times \Gamma_{SiGe} \quad (4)$$

where $\Delta n_{Si}$ (<0) is the variation of the refractive index of the first and third semiconductor layers by carrier injection, and $\Delta n_{SiGe}$ (<0) is the variation of the refractive index of the second semiconductor layer 12 by carrier injection.

Now, as depicted in FIG. 17, by current injection, the carrier density in the second semiconductor layer (SiGe layer) 12 increases from the intrinsic carrier density (around $10^{10}$ cm$^{-3}$) to $10^{17}$-$10^{19}$ cm$^{-3}$. At this time, the carrier density of the first and third semiconductor layers (Si layer) 10, 13 increases to $10^{16}$-$10^{17}$ cm$^{-3}$.

That is, a carrier density variation in the first semiconductor layer (Si layer) 10 and the third semiconductor layer (Si layer) 13 by current injection is smaller by one digit or more than a carrier density variation in the second semiconductor layer (SiGe layer) 12. Therefore, the equivalent refractive index variation $\Delta n_{eq}$ is approximated by expression (5). Similarly, the equivalent refractive index variation of the SiGe phase shifter portion is represented by expression (5).

$$\Delta n_{eq} \approx \Delta n_{SiGe} \times \Theta_{SiGe} \quad (5)$$

As illustrated by reference to FIG. 17, the carrier density in the second semiconductor layer 12 increases when the third semiconductor layer 13 is provided. By this, the absolute value of the refractive index variation $\Delta n_{SiGe}$ (<0) in the second semiconductor layer 12 increases by providing the third semiconductor layer 13.

On the other hand, when the third semiconductor layer 13 is provided, the optical confinement coefficient $\Gamma_{SiGe}$ of the second semiconductor layer 12 decreases due to the decrease of the second semiconductor layer 12 thickness. As such, there is a tradeoff relation between the refractive index variation $\Delta n_{SiGe}$ of the second semiconductor layer 12 and the optical confinement coefficient $\Gamma_{SiGe}$ of the second semiconductor layer 12. When a band gap difference between the first semiconductor layer 10 and the second semiconductor layer 12 is sufficiently large, sufficient carriers are accumulated in the second semiconductor layer 12. Consequently, the refractive index variation $\Delta n_{SiGe}$ exceeds the reduction of the optical confinement coefficient $\Gamma_{SiGe}$, and the variation absolute value (absolute value of the variation) of the equivalent refractive index of the Si/SiGe phase shifter portion 2 becomes lager than the variation absolute value of the equivalent refractive index of the SiGe phase shifter portion.

However, when the band gap of the first semiconductor layer 10 is close to the band gap of the second semiconductor layer 12, there may be a case that the variation absolute value of the equivalent refractive index ($-\Delta n_{eq}$) is decreased by providing the third semiconductor layer 13. For example, when the second semiconductor layer 12 is a $Si_{0.1}Ge_{0.9}$ layer, the variation absolute value of the equivalent refractive index of the Si/SiGe phase shifter portion 2 becomes smaller than the variation absolute value of the equivalent refractive index of the SiGe phase shifter portion.

Therefore, according to the present embodiment, the band gap difference between the second semiconductor layer 12 and the first semiconductor layer 10 is increased by setting the Ge composition ratio of the second semiconductor layer 12 to be 0.3.

Namely, the band gap of the second semiconductor layer 12 is set in a such manner that the variation absolute value of the equivalent refractive index of the core 19 produced by carrier injection becomes larger than the variation absolute value of the equivalent refractive index of the core in the SiGe phase to shifter portion produced by carrier injection. The same is applicable to the embodiments described below.

Here, as depicted in FIG. 2, the core 19 is a rib portion (hereafter referred to as three-layer rib portion) including the second semiconductor layer 12, the third semiconductor layer 13 and the first semiconductor layer 10 underneath the second semiconductor layer 12. On the other hand, the core in the SiGe phase shifter portion is a rib portion (hereafter referred to as two-layer rib portion) including the second semiconductor layer 12 and the first semiconductor layer 10 underneath the second semiconductor layer 12, with an identical size to the three-layer rib portion. Here, the thicknesses of the first semiconductor layers 10 in the three-layer rib portion and in the two-layer rib portion are equal.

Typically, the band gap of the second semiconductor layer (SiGe layer) 12 is set not larger than the band gap of the $Si_{0.83}Ge_{0.17}$. In other words, the Ge composition ratio of the second semiconductor layer (SiGe layer) 12 is set to be 0.17 or greater. Here, the first and third semiconductor layers are Si layers.

As illustrated in the embodiment 1, preferably the Ge composition ratio of the second semiconductor layer 12 is 0.35 or smaller, because of a restriction based on the operating wavelength. Therefore, the Ge composition ratio of the second semiconductor layer 12 is set to be 0.17 or greater and 0.35 or smaller.

Additionally, by making larger the Ge composition of the second semiconductor layer 12, the optical confinement coefficient $\Gamma_{SiGe}$ also becomes larger. The above increase of the optical confinement coefficient $\Gamma_{SiGe}$ also contributes to the increase of the variation absolute value of the equivalent refractive index in the core 19.

(2) Thickness of the Third Semiconductor Layer

Figure 19:
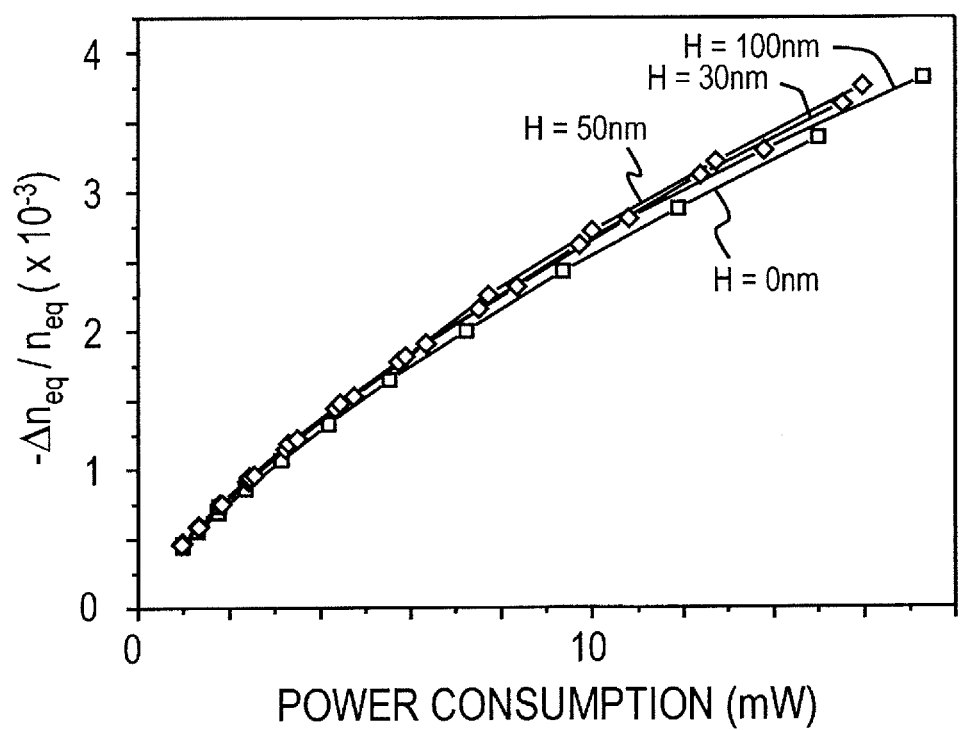
FIG. 19 is a diagram depicting relationships between the power consumption of the Si/SiGe phase shifter portion and the variation absolute value of a normalized equivalent refractive index of the core.

FIG. 19 is a diagram depicting relationships between the power consumption of the Si/SiGe phase shifter portion 2 and the variation absolute value of a normalized equivalent refractive index of the core 19 (i.e. $-\Delta n_{eq}/n_{eq}$). The horizontal axis denotes the power consumption. The vertical axis denotes the variation absolute value of the normalized equivalent refractive index.

In FIG. 19, there is depicted the variation absolute value of the normalized equivalent refractive index relative to a plurality of cores 19 having different thicknesses H of the third semiconductor layer 13 (refer to FIG. 2). Here, the sizes (thickness and width) of the core 19 are constant. The structure of the simulation model is identical to the model of the Si/SiGe phase shifter portion depicted in FIG. 17, except for the thickness H of the third semiconductor layer 13.

As depicted in FIG. 19, when the thickness H of the third semiconductor layer is in the range of 30-100 nm, the variation absolute value of the normalized equivalent refractive index becomes about 10% larger than the variation absolute value of the normalized equivalent refractive index when H is 0 nm.

As depicted in FIG. 19, the rate of increase in the variation absolute value hardly varies if the thickness H of the third semiconductor layer 13 varies between 30 and 100 nm. The reason is that the refractive index variation $\Delta n_{SiGe}$ of the second semiconductor layer 12 caused by the increased thickness H of the third semiconductor layer 13 is canceled by the decrease of the optical confinement coefficient $\Gamma_{SiGe}$.

The thickness (H=30 to 100 nm) of the third semiconductor layer 13 other than 0 nm depicted in FIG. 19 is in the range of 15 to 50% relative to the sum (200 nm) of thicknesses of the second semiconductor layer 12 and the third semiconductor layer 13. If the thickness H is in the above-mentioned range, the variation absolute value of the normalized equivalent refractive index increases about 10%, as depicted in FIG. 19. Therefore, preferably the thickness of the third semiconductor layer 13 is 15-50% as large as the thickness of the convex portion 21 which includes the second semiconductor layer 12 and the third semiconductor layer 13. If the thickness H deviates from this range, the variation absolute value of the equivalent refractive index gradually decreases.

Preferably, the thickness of the overall convex portion 21 is 100 nm to 300 nm through which light in the fundamental mode may easily propagate, and more preferably, 150 to 250 nm.

Also, it may be considered that the third semiconductor layer 13 is provided between the first semiconductor layer 10 and the second semiconductor layer 12, not on the upper surface of the second semiconductor layer 12. However, such a structure is not preferable because the optical confinement coefficient $\Gamma_{SiGe}$ of the second semiconductor layer 12 becomes small.

In the present embodiment, preferable ranges of the band gap and the thickness of the second semiconductor layer 12 included in the phase shifter portion 2 have been described. For the band gap of the second semiconductor layer in the gate optical switch, it is also preferable to apply the same range.

(Embodiment 4)

A semiconductor optical device according to the present embodiment is an MZ optical switch, similar to the embodiment 1. Therefore, the description of portions common to the embodiment 1 will be omitted.

(1) Structure and Characteristics

Figure 20:
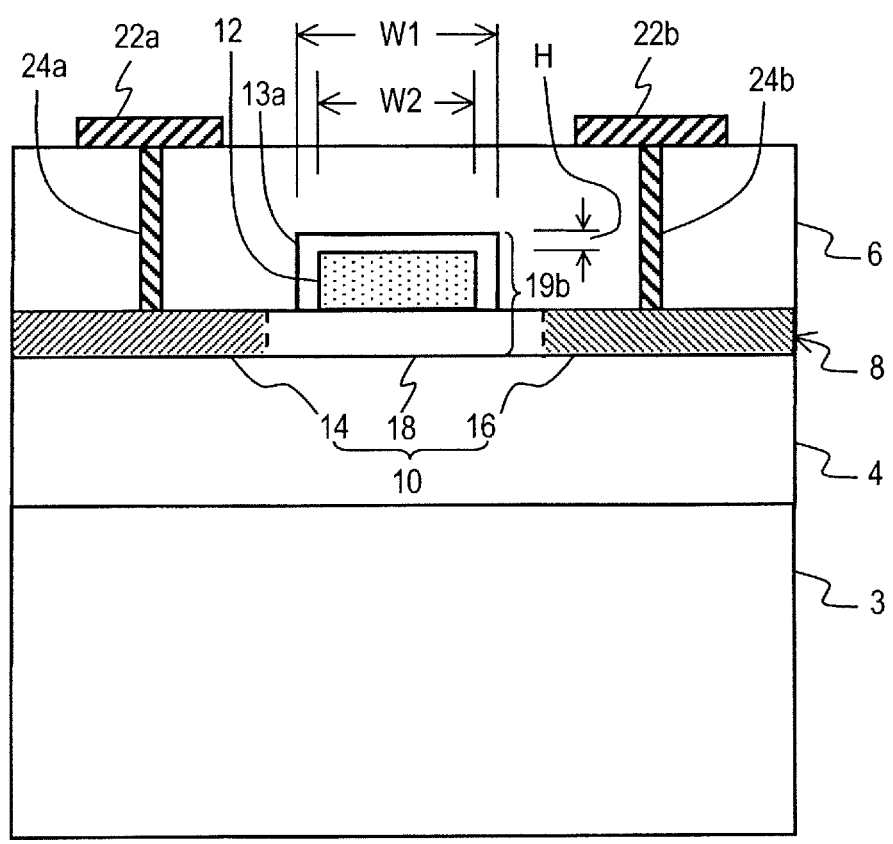
FIG. 20 is a cross-sectional view of a phase shifter portion of the MZ optical switch according to the embodiment 4.

FIG. 20 is a cross-sectional view of a phase shifter portion 2e of the MZ optical switch according to the present embodiment. As depicted in FIG. 20, the phase shifter portion 2e according to the present embodiment includes a structure substantially identical to the phase shifter portion 2 of the embodiment 1. However, a third semiconductor layer 13a covers the side faces of the second semiconductor layer 12. By this, the carrier density in the second semiconductor layer 12 is higher than that in the embodiment 1, and as a result, the power consumption of the MZ optical switch is smaller than that in the MZ optical switch according to the embodiment 1.

Figure 21:
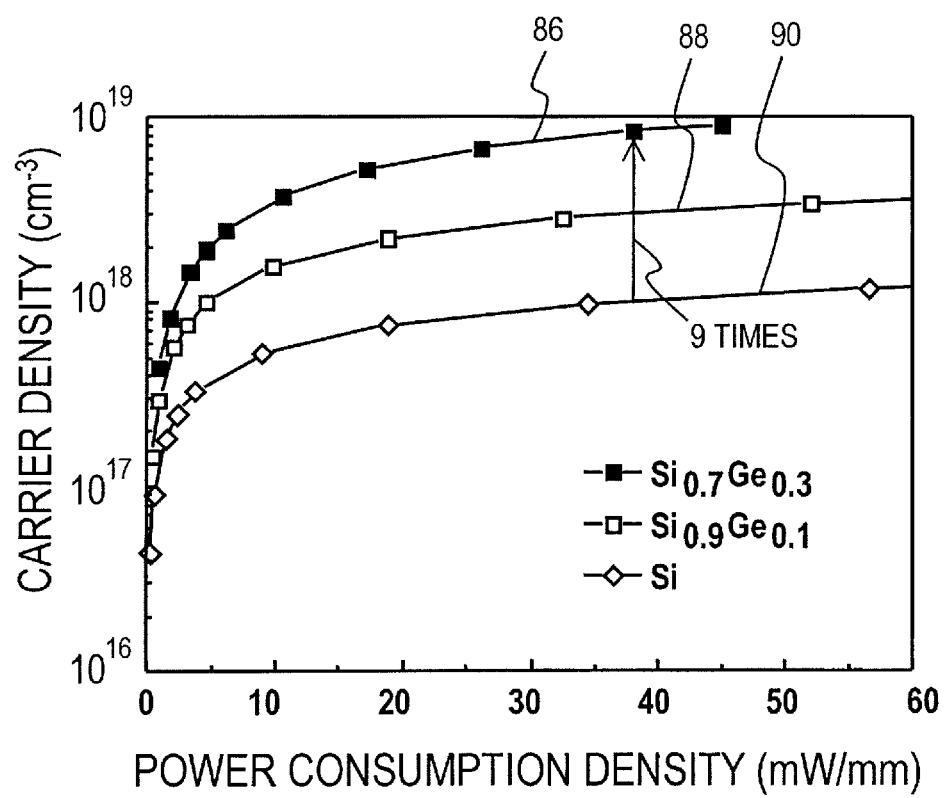
FIG. 21 is a diagram depicting relationships between a power consumption density of the phase shifter portion and a carrier density in the second semiconductor layer.

FIG. 21 is a diagram depicting relationships between a power consumption density of the phase shifter portion 2e and a carrier density in the second semiconductor layer 12. The horizontal axis denotes the power consumption density (=current×voltage/device length). The vertical axis denotes the carrier density (=electron density+hole density) of the second semiconductor layer 12. The carrier density depicted in FIG. 21 is obtained from simulation, similar to the carrier density depicted in FIG. 6.

A model used for simulation is substantially identical to the model of FIG. 6. However, the width of the second semiconductor layer 12 is 400 nm. The width of a core portion 19b including the third semiconductor layer 13 is identical to the width (480 nm) of the core 19 of the embodiment 1. Therefore, the thickness of the third semiconductor layer 13 covering the side faces of the second semiconductor layer 12 is 40 nm. The lifetime of minority carriers is 2 ns, which is longer than the embodiment 1. The above value (2 ns) is based on an actually measured value of the carrier lifetime.

In FIG. 21, a first curve 86 and a second curve 88 depict the relationships when the second semiconductor layer 12 is a $Si_{0.7}Ge_{0.3}$ layer and a $Si_{0.9}Ge_{0.1}$ layer, respectively. A third curve 90 depicts a relationship concerning the homojunction phase shifter portion between a power consumption density and a carrier density in the core. The structural parameters of the homojunction phase shifter portion (such as core size and impurity concentration in the n-type and p-type regions) are identical to those of the phase shifter portion 2e.

As depicted in FIG. 21, each carrier density 86, 88 in the phase shifter portion 2e is greatly higher than a carrier density 90 in the homojunction phase shifter portion.

For example, when the second semiconductor layer 12 is the $Si_{0.7}Ge_{0.3}$ layer, the carrier density in the phase shifter portion 2e is approximately nine times larger than the carrier density in the homojunction phase shifter portion, at the power consumption density of 40 mW/mm.

As described earlier, the rate of increase in the carrier density by the embodiment 1 is about 5 times. As such, according to the present embodiment, the carrier density in the second semiconductor layer 12 increases more than that in the embodiment 1. The reason is that the width W2 of the second semiconductor layer 12 becomes narrower than the width W1 of the core 19b by the thickness of the third semiconductor layer 13a. By the way, the carrier density in the homojunction phase shifter portion (the third curve 90) is slightly different from the carrier density in the homojunction phase shifter portion depicted in FIG. 6 (the third curve 34). The above difference is caused by the difference of the minority carrier lifetime used in the simulation. The same is applicable to the following descriptions.

Figure 22:
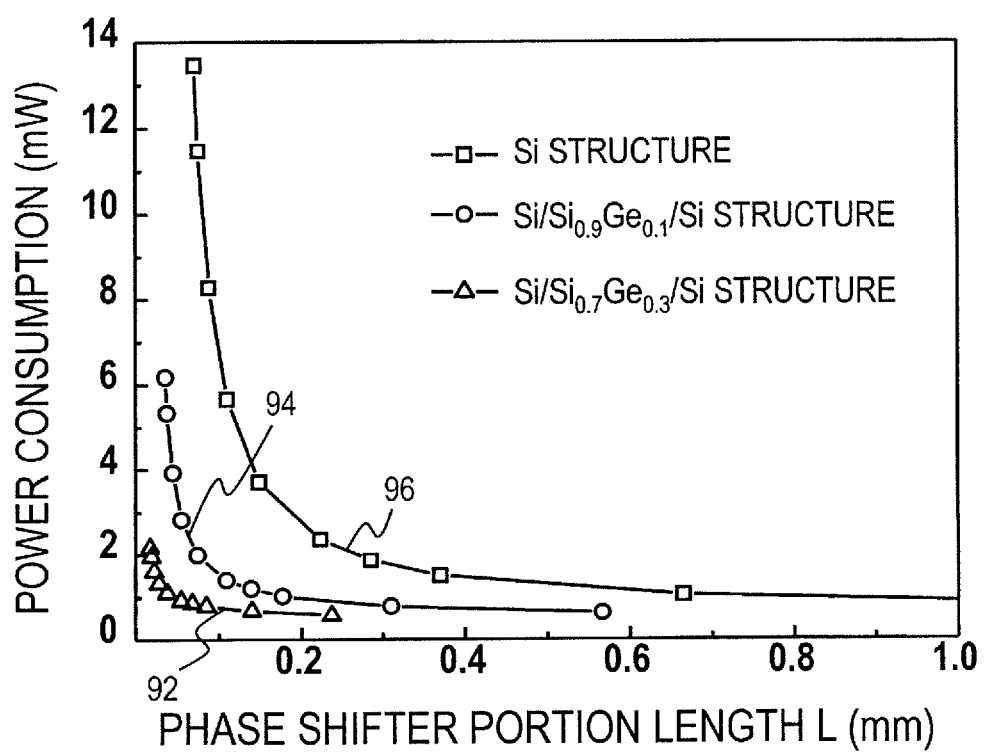
FIG. 22 is a diagram depicting relationships between a length L of the phase shifter portion according to the embodiment 4 and power consumption to switch off the output light of the MZ optical switch.

FIG. 22 is a diagram depicting relationships between a length L of the phase shifter portion 2e and power consumption to switch off the output light of the MZ optical switch. The horizontal axis depicts the length L of the phase shifter portion 2e. The vertical axis depicts the power consumption to switch off the output light. A model used for simulation is identical to the model of FIG. 21.

In FIG. 22, a first curve 92 and a second curve 94 depict the relationships when the second semiconductor layer 12 is a $Si_{0.7}Ge_{0.3}$ layer and a $Si_{0.9}Ge_{0.1}$ layer, respectively. On the other hand, a third curve 96 depicts a relationship between a length L of the first phase shifter portion in the homojunction MZ optical switch and power consumption to switch off the output light.

As depicted in FIG. 22, when the length L of the phase shifter portion is identical, power consumption 92, 94 of the MZ optical switch according to the present embodiment is exceedingly smaller than power consumption 96 of the homojunction MZ optical switch. For example, when the length of the phase shifter portion is 0.1 mm, the power consumption 96 of the homojunction MZ optical switch is 6.8 mW. In contrast, the power consumption 92 of the MZ optical switch in which the second semiconductor layer 12 is the $Si_{0.7}Ge_{0.3}$ layer is 0.8 mW. Namely, according to the MZ optical switch of the present embodiment, the power consumption decreases 88%. The power consumption of the MZ optical switch in which the second semiconductor layer 12 is the $Si_{0.9}Ge_{0.1}$ layer is also smaller than the MZ optical switch which includes the homojunction.

When comparison is made on an identical condition, power consumption of the MZ optical switch in the embodiment 1 is reduced by 85%. This reduction rate does not reach the reduction rate 88% of the present embodiment. That is, according to the present embodiment, the power consumption of the MZ optical switch is smaller than that of the embodiment 1. Alternatively, it is possible to shorten the device length of the MZ optical switch without varying power consumption.

Figure 23:
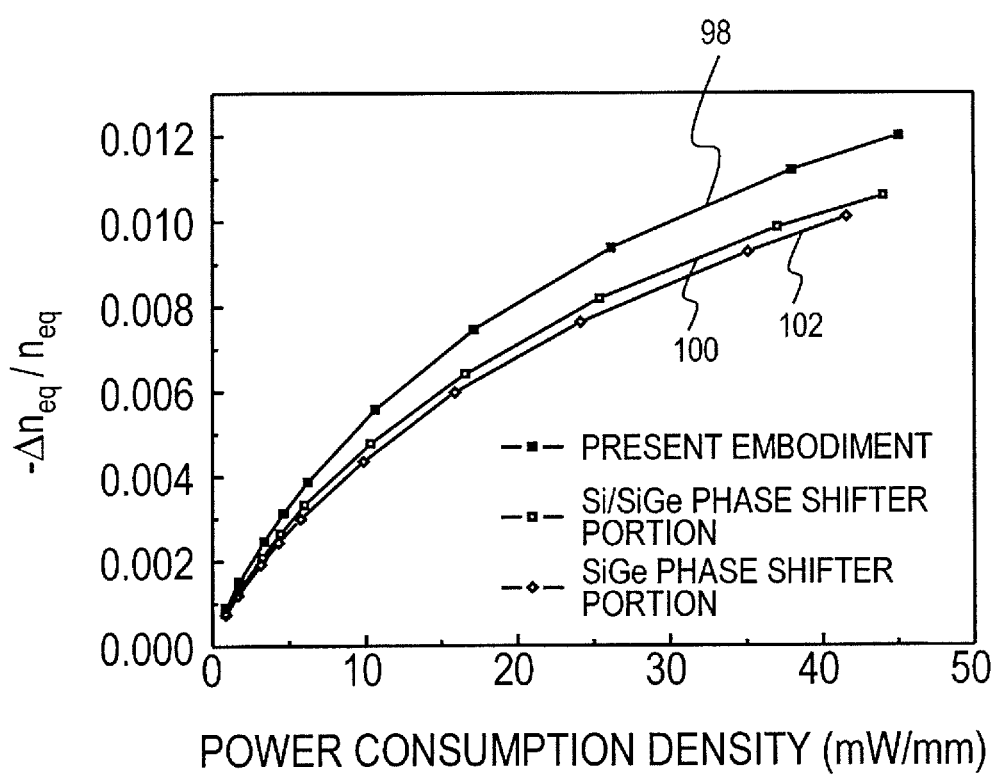
FIG. 23 is a diagram depicting a relationship between the power consumption of the phase shifter portion according to the embodiment 4 and the variation absolute value of the normalized equivalent refractive index of the core therein.

FIG. 23 is a diagram depicting a relationship between the power consumption of the phase shifter portion 2e and the variation absolute value of the normalized equivalent refractive index of the core therein ($-\Delta n_{eq}/n_{eq}$). The horizontal axis denotes the power consumption. The vertical axis denotes the variation absolute value of the normalized equivalent refractive index.

A first curve 98 in FIG. 23 depicts the variation absolute value of the normalized equivalent refractive index of the phase shifter portion 2e according to the present embodiment. A second curve 100 depicts the variation absolute value of the normalized equivalent refractive index of the Si/SiGe phase shifter portion described in the embodiment 3. A third curve 102 depicts the variation absolute value of the normalized equivalent refractive index of the SiGe phase shifter portion described in the embodiment 3.

Each model of the Si/SiGe phase shifter portion and the SiGe phase shifter portion is identical to the model in the embodiment 3 (that is, the core size etc. are identical to those of the phase shifter portion 2e). The minority carrier lifetime is 2 ns which is identical to that of the phase shifter portion 2e.

As depicted in FIG. 23, the variation absolute value 98 of the normalized equivalent refractive index of the phase shifter portion 2e in the vicinity of the power consumption of 40 mW/mm is approximately 15% larger than each variation absolute value of the normalized equivalent refractive indexes of the Si/SiGe phase shifter portion and the SiGe phase shifter portion.

Therefore, the power consumption of the phase shifter portion 2e is smaller than power consumption of the Si/SiGe phase shifter portion and the SiGe phase shifter portion. The reason is that a carrier concentration in the second semiconductor layer 12 increases because a width W2 of the second semiconductor layer 12 is narrowed by the third semiconductor layer 13a.

Additionally, a preferable range of the Ge composition ratio of the second semiconductor layer 12 is 0.17 or more and 0.35 or less, similar to the embodiment 3. Also, similar to the embodiment 1, the second semiconductor layer 12 may be disposed in the groove formed on the i-type region of the first semiconductor layer 10.

(2) Manufacturing Method

Figure 24A:
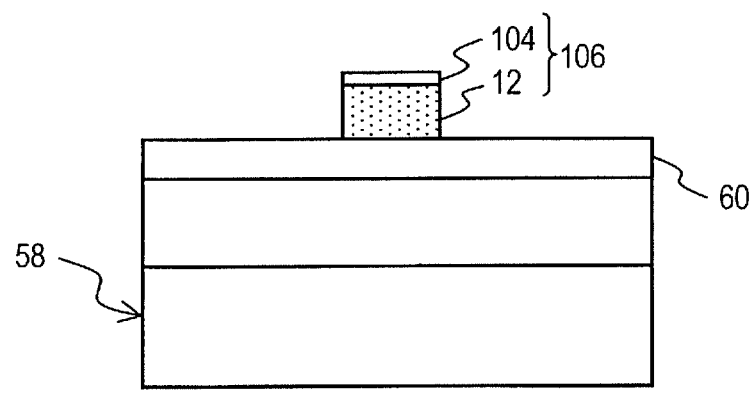
FIGS. 24A-24B are process cross-sectional views illustrating the manufacturing method of the MZ optical switch according to the embodiment 4.
Figure 24B:
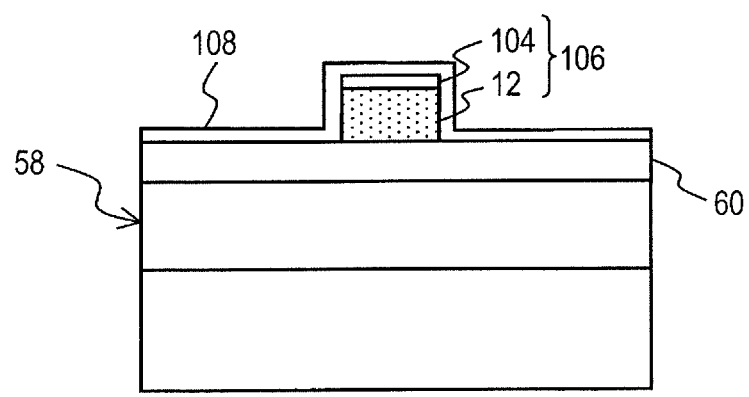

FIGS. 24A-24B are process cross-sectional views illustrating the manufacturing method of the MZ optical switch according to the present embodiment. First, as depicted in FIG. 24A, on the surface of an SOI substrate 58, a stripe-shaped convex portion 106, which includes a SiGe layer (second semiconductor layer 12) and a Si layer 104 covering the top surface of the SiGe layer 12, is formed. The formation procedure of the convex portion 106 is identical to the procedure of the embodiment 1 having been described by reference to FIGS. 11A through 12B.

Next, a Si layer 108 is grown on the surface of the SOI substrate 58. At this time, the Si layer 108 is grown on the top surface of the convex portion 106, the side face of the convex portion 106 and the surface of the SOI substrate 58 (refer to FIG. 24B).

Out of the Si layer 108, a portion grown on the top surface and the side faces of the convex portion 106 are integrated with the Si layer 104 covering the top surface of the SiGe layer 12, so as to become a third semiconductor layer 13a covering the SiGe layer 12. On the other hand, out of the Si layer 108, portions grown on the surface of the SOI substrate 58 is integrated with the Si layer 60 of the SOI substrate, so as to become a first semiconductor layer 10.

Thereafter, an MZ optical switch is formed according to substantially identical steps to the procedure described by reference to FIGS. 12C through 13C.

Figure 25:
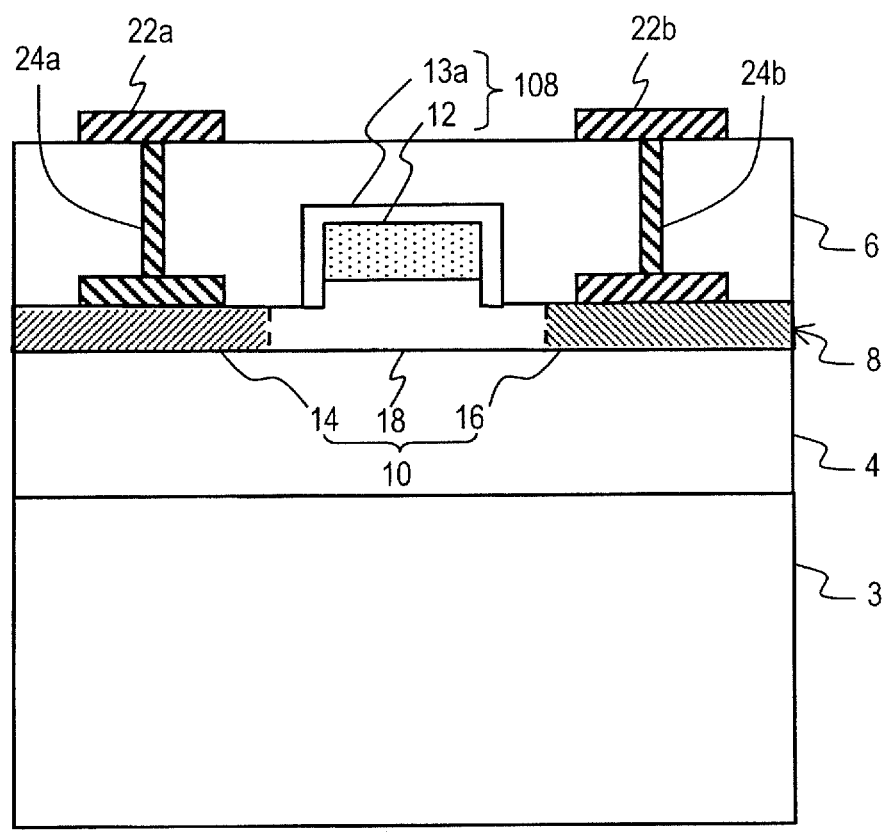
FIG. 25 is a cross-sectional view illustrating a deformed example of the MZ optical switch according to the embodiment 4.

FIG. 25 is a cross-sectional view illustrating a deformed example of the MZ optical switch according to the present embodiment. As depicted in FIG. 25, the first semiconductor layer 10 on both sides of the convex portion 108 including the second semiconductor layer 12 and the third semiconductor layer 13a (that is, both sides of the second semiconductor layer 12) is thinner than a region thereof contacting to the second semiconductor layer 12, similar to the embodiment 1.

(Embodiment 5)

A semiconductor optical device according to the present embodiment is a gate optical switch, similar to the embodiment 2. Therefore, the description of portions common to the embodiment 2 will be omitted.

(1) Structure and Characteristics

The structure of the gate optical switch according to the present embodiment is substantially identical to the structure of the phase shifter portion 2e according to the embodiment 4, except for a long device length. The device length of the phase shifter portion 2e according to the embodiment 4 is 0.1 mm, for example. On the other hand, the device length of the gate optical switch according to the present embodiment is 1 mm, for example. The plan view and the cross-sectional view of the gate optical switch according to the present embodiment are substantially identical to FIG. 1 and FIG. 20, respectively.

Figure 26:
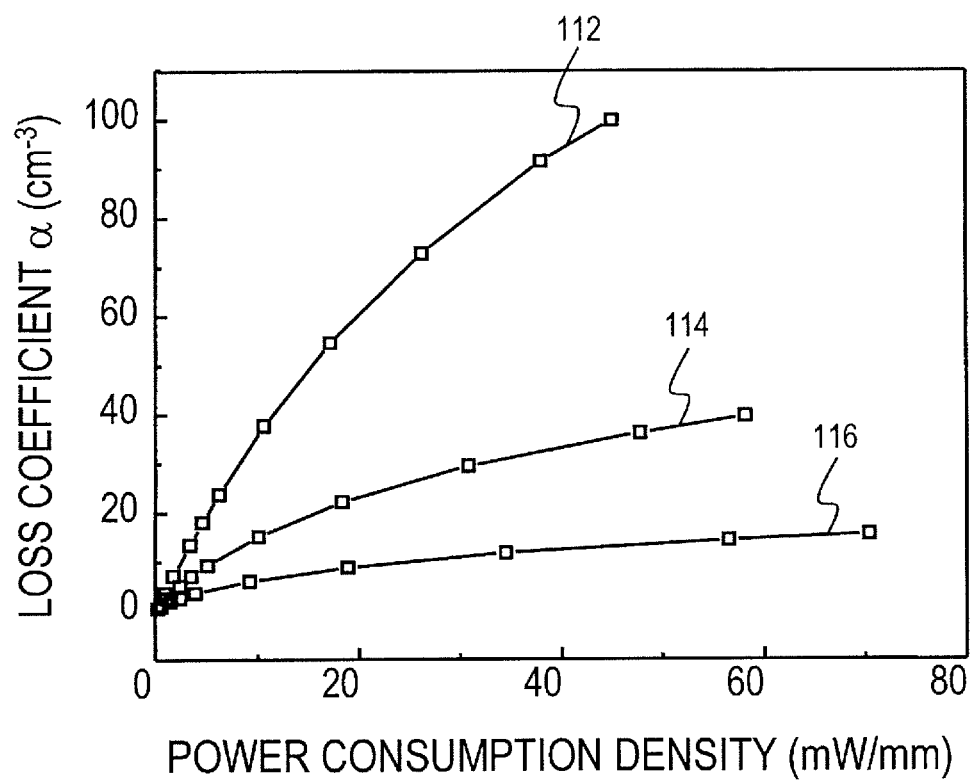
FIG. 26 is a diagram depicting relationships between a power consumption density of the gate optical switch according to the embodiment 5 and a loss coefficient $\alpha$ of the core.

FIG. 26 is a diagram depicting relationships between a power consumption density of the gate optical switch according to the present embodiment and a loss coefficient α of the core 19. The horizontal axis denotes the power consumption density. The vertical axis denotes the loss coefficient of the core. A model used for simulation is identical to the model used in the simulation of FIG. 21.

In FIG. 26, the loss coefficient of the gate optical switch in which the Ge composition ratio of the second semiconductor layer 12 is 0.3 (first curve 112) and the loss coefficient of the gate optical switch in which the Ge composition ratio of the second semiconductor layer 12 is 0.1 (second curve 114) are depicted. Also, in FIG. 26, the loss coefficient of the homojunction gate optical switch using a silicon core is depicted (third curve 116).

As depicted in FIG. 26, according to the gate optical switch of the present embodiment, power consumption is greatly reduced as compared to the homojunction gate optical switch. For example, in the case of the homojunction gate optical switch, the power consumption producing the loss coefficient α of 13 cm$^{-1}$ is 60 mW (refer to the third curve 116). On the other hand, in the gate optical switch according to the present embodiment, power consumption producing the loss coefficient α of 13 cm$^{-1}$ is about 4 mW, when the Ge composition ratio of the second semiconductor layer 12 is 0.3.

Namely, according to the gate optical switch of the present embodiment, power consumption 112 is about 93% smaller than the power consumption 116 of the homojunction gate optical switch. The reduction rate of the above power consumption is larger than the reduction rate of the power consumption of the embodiment 2.

(Embodiment 6)

A semiconductor optical device according to the present embodiment is an MZ optical switch, similar to the embodiment 1. Therefore, the description of portions common to the embodiment 2 will be omitted.

Figure 27:
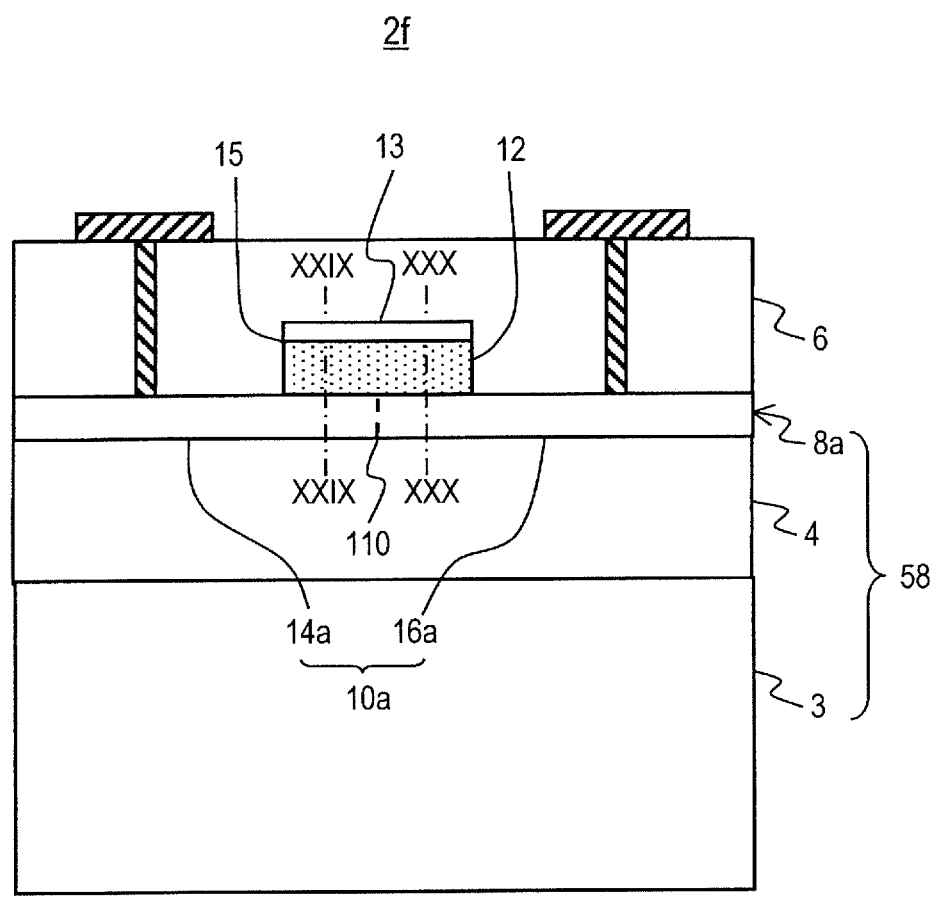
FIG. 27 is a cross-sectional view of a phase shifter portion in the MZ optical switch according to the present embodiment 6.

FIG. 27 is a cross-sectional view of a phase shifter portion 2f in the MZ optical switch according to the present embodiment. Similar to the phase shifter portion 2 according to the embodiment 1, the phase shifter portion 2f includes a first clad layer (for example, SiO$_2$ layer of the SOI substrate 58) 4 and a second clad layer (for example, SiO$_2$ layer) 6. Further, the phase shifter portion 2f includes an optical waveguide layer 8a sandwiched between the first clad layer 4 and the second clad layer 6.

As depicted in FIG. 27, the optical waveguide layer 8a includes a first semiconductor layer (for example, single-crystal silicon layer) 10a and an i-type second semiconductor layer (for example, single-crystal SiGe layer) 12 which is provided on the first semiconductor layer 10a and extends in one direction. The optical waveguide layer 8a further includes a third semiconductor layer (for example, single-crystal Si layer) 13 which covers the top surface (a surface 15 opposite to the surface on the side of the first semiconductor layer 10a) of the second semiconductor layer 12. Similar to the embodiment 4, the third semiconductor layer 13 may cover the side faces of the second semiconductor layer 12.

The first semiconductor layer 10a includes an n-type region 14a and a p-type region 16a which contacts to the n-type region 14a and has a boundary 110 with the n-type region 14a extending in one direction. The n-type region 14a and the p-type region 16a form a p-n junction.

Figure 28:
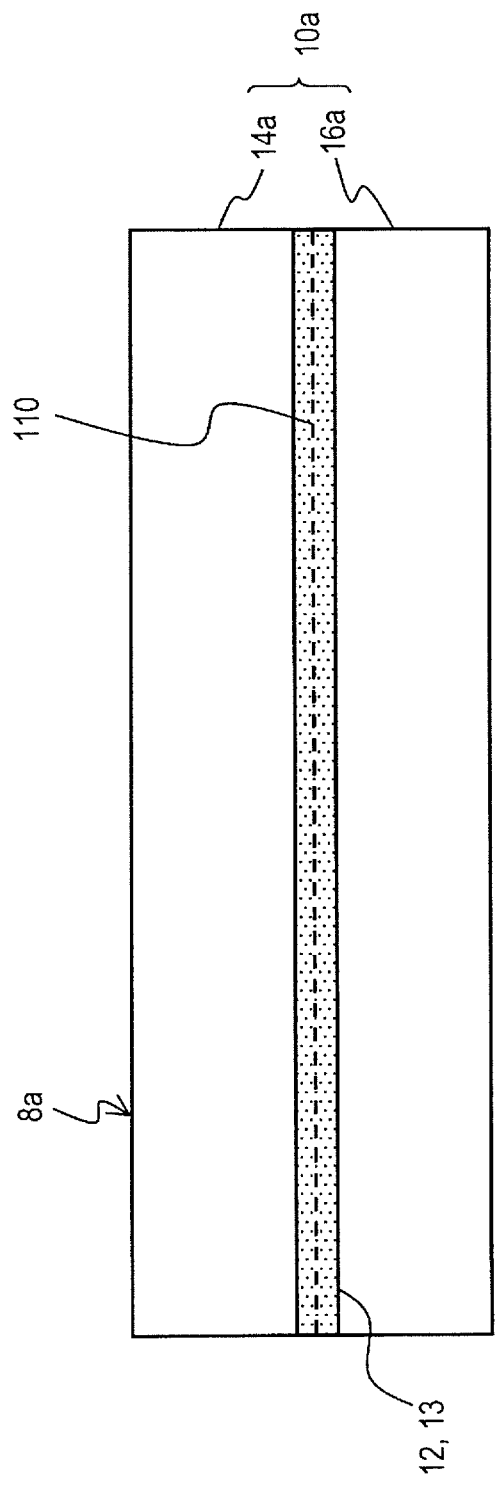
FIG. 28 is a plan view of the optical waveguide layer according to the present embodiment 6.

FIG. 28 is a plan view of the optical waveguide layer 8a. The second semiconductor layer 12 is disposed on the boundary 110 as depicted in FIG. 28, and has a band gap narrower than the first semiconductor layer 10a and the third semiconductor layer 13.

Figure 29:
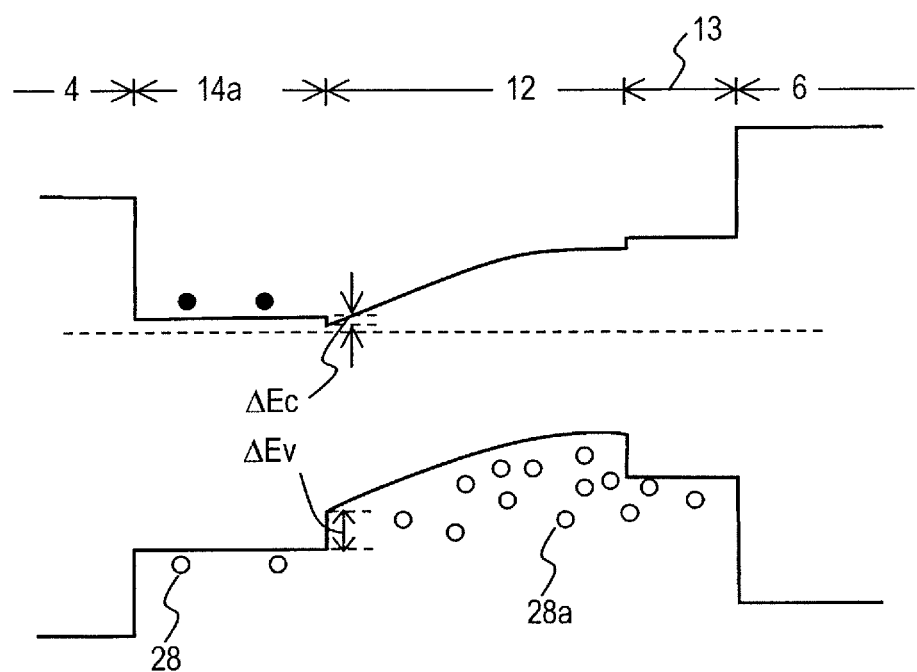
FIG. 29 is a band diagram along a line XXIX-XXIX depicted in FIG. 27.
Figure 30:
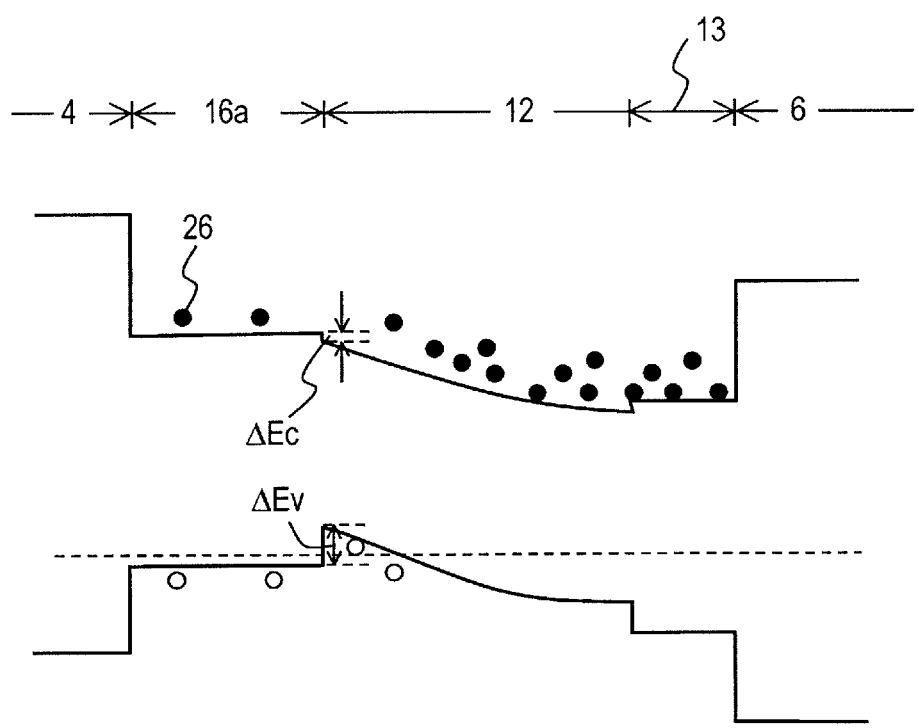
FIG. 30 is a band diagram along a line XXX-XXX depicted in FIG. 27.

FIG. 29 is a band diagram along a line XXIX-XXIX depicted in FIG. 27. FIG. 30 is a band diagram along a line XXX-XXX depicted in FIG. 27. In FIGS. 29 and 30, each state that a forward direction voltage is applied to the p-n junction between the p-type region 16a and the n-type region 14a is depicted.

When the forward direction voltage is applied to the p-n junction, as depicted in FIG. 29, holes 28 are supplied into the n-type region 14a, so as to diffuse to the second semiconductor layer 12. The holes 28a diffused to the second semiconductor layer 12 are accumulated into the second semiconductor layer 12 by $\Delta E_V$. By this, the hole density in the second semiconductor layer 12 increases.

Further, when the forward direction voltage is applied to the p-n junction between the p-type region 16a and the n-type region 14a, electrons 26 are supplied into the p-type region 16a, as depicted in FIG. 30. The electrons 26 diffuse to the second semiconductor layer 12 and are accumulated into the second semiconductor layer 12 by $\Delta E_C$. By this, the electron density in the second semiconductor layer 12 increases.

As such, according to the phase shifter portion 2f of the present embodiment, the carrier density in the second semiconductor layer 12 increases. As a result, power consumption to switch off the MZ optical switch decreases. Or, if the power consumption is unchanged, the device length of the MZ optical switch is shortened.

Additionally, according to the phase shifter portion 2f of the present embodiment, because the second semiconductor layer 12 is disposed on the n-type region 14a and the p-type region 16a, propagating light is attenuated to some extent by carriers which are originally existent in these regions. Therefore, preferably the phase shifter portion 2f may be used for a usage where such attenuation does not cause a problem.

In the aforementioned embodiments, the first semiconductor layer 10 and the third semiconductor layer 13 are the single-crystal Si layers. However, the first semiconductor layer 10 and the third semiconductor layer 13 may be other semiconductor layers, such as a single-crystal GaAs layer and a single-crystal InP layer. Similarly, the second semiconductor layer 12 may be a semiconductor layer other than the single-crystal SiGe layer, such as a single-crystal InGaAs layer and a single-crystal InGaAsP layer.

Also, in the aforementioned embodiments, the first semiconductor layer 10 is the silicon layer of the SOI substrate. However, the first semiconductor layer 10 may be a different semiconductor layer, such as a silicon layer disposed on the surface of a quartz substrate.

Further, in the aforementioned embodiments, the first clad layer 4 and the second clad layer 6 are $SiO_2$. However, the first clad layer 4 and the second clad layer 6 may be other insulator layers, such as a silicon oxynitride layer (SiNO layer) and a silicon nitride layer (SiN layer).

Also, in the aforementioned embodiments, only the optical members are provided on the SOI substrate. However, electronic circuits (for example, optical switch drive circuit) may be provided on the SOI substrate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor optical device comprising:
a first clad layer, a second clad layer and an optical waveguide layer sandwiched between the first clad layer and the second clad layer,
wherein the optical waveguide layer includes a first semiconductor layer, a second semiconductor layer disposed on the first semiconductor layer and extending in one direction, and a third semiconductor layer covering a top surface of the second semiconductor layer, and
wherein the first semiconductor layer includes an n-type region disposed on one side of the second semiconductor layer, a p-type region disposed on the other side of the second semiconductor layer, an i-type region disposed between the n-type region and the p-type region, and a p-i-n homojunction to which a forward voltage is applied and which includes the p-type region and the i-type region and the n-type region, and
wherein the second semiconductor layer has a band gap narrower than band gaps of the first semiconductor layer and the third semiconductor layer, and
wherein the band gap of the second semiconductor layer is set so that an absolute value of a variation of an equivalent refractive index of a three-layered rib portion including the second semiconductor layer, the third semiconductor layer and the first semiconductor layer on a lower side of the second semiconductor layer, which is produced by carrier injection into the three-layered rib portion, is larger than an absolute value of a variation of an equivalent refractive index of a two-layered rib portion which includes the second semiconductor layer and the first semiconductor layer on a lower side of the second semiconductor layer and has an identical size to the three-layered rib portion, which is produced by carrier injection into the two-layered rib portion.

2. The semiconductor optical device according to claim 1, wherein the third semiconductor layer further covers side faces of the second semiconductor layer.

3. The semiconductor optical device according to claim 1, further comprising:
a groove disposed on the i-type region,
wherein the second semiconductor layer is disposed on the groove, and at least a portion of side faces thereof contacts to the i-type region.

4. The semiconductor optical device according to claim 1, wherein the first semiconductor layer is thinner than a region thereof contacting to the second semiconductor layer on both sides of the second semiconductor layer.

5. The semiconductor optical device according to claim 1, wherein the first semiconductor layer and the third semiconductor layer are single-crystal silicon layers, and
wherein the second semiconductor layer is a single-crystal silicon germanium layer.

6. The semiconductor optical device according to claim 5, wherein a composition ratio of germanium in the second semiconductor layer is greater than 0 and not greater than 0.35.

7. The semiconductor optical device according to claim 5, wherein the first semiconductor layer, the second semiconductor layer and the third semiconductor layer have a (110) plane direction.

8. A semiconductor optical device comprising:
a first clad layer, a second clad layer and an optical waveguide layer sandwiched between the first clad layer and the second clad layer,
wherein the optical waveguide layer includes a first semiconductor layer, a second semiconductor layer disposed on the first semiconductor layer and extending in one direction, and a third semiconductor layer covering a top surface of the second semiconductor layer, and
wherein the first semiconductor layer includes an n-type region, a p-type region contacting to the n-type region and having a boundary with the n-type region extending in the one direction, and a pn homojunction to which a forward voltage is applied and which includes the p-type region and the n-type region, and
wherein the second semiconductor layer is disposed on the boundary and has a band gap narrower than band gaps of the first semiconductor layer and the third semiconductor layer, and
wherein the band gap of the second semiconductor layer is set so that an absolute value of a variation of an equivalent refractive index of a three-layered rib portion including the second semiconductor layer, the third semiconductor layer and the first semiconductor layer on a lower side of the second semiconductor layer, which is produced by carrier injection into the three-layered rib portion, is larger than an absolute value of a variation of an equivalent refractive index of a two-layered rib portion which includes the second semiconductor layer and the first semiconductor layer on a lower side of the second semiconductor layer and has an identical size to the three-layered rib portion, which is produced by carrier injection into the two-layered rib portion.

9. The semiconductor optical device according to claim 8, wherein the first semiconductor layer and the third semiconductor layer are single-crystal silicon layers, and wherein the second semiconductor layer is a single-crystal silicon germanium layer.

10. The semiconductor optical device according to claim 8, wherein the first semiconductor layer, the second semiconductor layer and the third semiconductor layer have a (110) plane direction.

\* \* \* \* \*